(12) United States Patent
Tanaka et al.

(10) Patent No.: US 11,153,514 B2
(45) Date of Patent: Oct. 19, 2021

(54) SOLID-STATE IMAGING DEVICE, METHOD FOR DRIVING SOLID-STATE IMAGING DEVICE, AND ELECTRONIC APPARATUS

(71) Applicant: BRILLNICS SINGAPORE PTE. LTD., Singapore (SG)

(72) Inventors: Shunsuke Tanaka, Tokyo (JP); Toshinori Otaka, Tokyo (JP); Takahiro Akutsu, Tokyo (JP)

(73) Assignee: BRILLNICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/203,136

(22) Filed: Nov. 28, 2018

(65) Prior Publication Data

US 2019/0166317 A1    May 30, 2019

(30) Foreign Application Priority Data

Nov. 30, 2017 (JP) ............................ JP2017-230521
Oct. 15, 2018 (JP) ............................ JP2018-194303

(51) Int. Cl.
*H04N 7/18* (2006.01)
*H04N 5/33* (2006.01)
(Continued)

(52) U.S. Cl.
CPC ....... *H04N 5/332* (2013.01); *H01L 27/14603* (2013.01); *H01L 27/14621* (2013.01);
(Continued)

(58) Field of Classification Search
CPC .................................................. H04N 5/332
(Continued)

(56) References Cited

U.S. PATENT DOCUMENTS 4,922,282 A * 5/1990 Koyama ................. G02B 7/34
250/201.2
5,521,733 A * 5/1996 Akiyama ........... G02B 6/29362
398/48
(Continued)

FOREIGN PATENT DOCUMENTS

EP    3133646 A2    2/2017
JP    2005-223681 A    8/2005
JP    2017-139286 A    8/2017

OTHER PUBLICATIONS

Taiwan Intellectual Property Office, Office Action issued in TW Application No. 20180142826, dated Oct. 14, 2019, pp. 1-12.
(Continued)

*Primary Examiner* — Leron Beck
(74) *Attorney, Agent, or Firm* — Pillsbury Winthrop Shaw Pittman LLP

(57) ABSTRACT

One object is to provide a solid-state imaging device that can capture visible light images such as RGB images and infrared images such as NIR images and maintain a high light-receiving sensitivity for infrared light, a method of driving such a solid-state imaging device, and an electronic apparatus. The solid-state imaging device includes: a pixel part having unit pixel groups arranged therein, the unit pixel groups each including a plurality of pixels at least for visible light that perform photoelectric conversion; and a reading part for reading pixel signals from the pixel part, wherein the plurality of pixels for visible light have a light-receiving sensitivity for infrared light, and in an infrared reading mode, the reading part is capable of adding together signals for infrared light read from the plurality of pixels for visible light.

25 Claims, 28 Drawing Sheets

(51) Int. Cl.
*H04N 9/04* (2006.01)
*H01L 27/146* (2006.01)
*H04N 5/3745* (2011.01)

(52) U.S. Cl.
CPC .. *H01L 27/14641* (2013.01); *H01L 27/14649* (2013.01); *H04N 5/37457* (2013.01); *H04N 9/0451* (2018.08); *H04N 9/04553* (2018.08); *H01L 27/14645* (2013.01)

(58) Field of Classification Search
USPC .......................................................... 348/164
See application file for complete search history.

(56) References Cited

U.S. PATENT DOCUMENTS

| | | | | |
|---|---|---|---|---|
| 5,924,792 | A * | 7/1999 | Cassarly | G02B 6/0006 362/294 |
| 6,301,042 | B1 * | 10/2001 | Pelekhaty | G02B 5/281 359/359 |
| 6,380,539 | B1 * | 4/2002 | Edgar | H04N 1/00795 250/339.05 |
| 6,462,866 | B1 * | 10/2002 | Sugiyama | G02B 5/282 359/356 |
| 6,774,963 | B1 * | 8/2004 | Nakao | G02F 1/133514 349/104 |
| 10,019,112 | B2 * | 7/2018 | Bakin | G06F 3/042 |
| 10,389,922 | B2 * | 8/2019 | Takita | H01L 27/14647 |
| 2002/0134940 | A1 * | 9/2002 | Ohkubo | G01N 21/3504 250/339.13 |
| 2005/0174512 | A1 * | 8/2005 | Roh | G02F 1/133514 349/106 |
| 2006/0124833 | A1 * | 6/2006 | Toda | H01L 27/14621 250/214 R |
| 2006/0291061 | A1 * | 12/2006 | Iyama | G02B 5/282 359/614 |
| 2007/0051876 | A1 * | 3/2007 | Sumi | G02B 5/282 250/214 R |
| 2007/0182844 | A1 * | 8/2007 | Allman | G02B 5/04 348/345 |
| 2007/0272836 | A1 | 11/2007 | Higashitsutsumi et al. | |
| 2008/0173795 | A1 * | 7/2008 | Kang | H01L 27/14621 250/208.1 |
| 2008/0204740 | A1 * | 8/2008 | Berg | G01B 11/16 356/239.2 |
| 2008/0315104 | A1 * | 12/2008 | Nam | H01L 27/14603 250/370.08 |
| 2009/0190226 | A1 * | 7/2009 | Mehrtens | F21V 9/08 359/589 |
| 2010/0220228 | A1 * | 9/2010 | Otake | H01L 27/14621 348/311 |
| 2010/0238330 | A1 | 9/2010 | Hirota | |
| 2010/0271525 | A1 * | 10/2010 | Takahashi | H03M 1/14 348/308 |
| 2011/0051260 | A1 * | 3/2011 | Nakayama | G02B 5/205 359/738 |
| 2011/0080636 | A1 * | 4/2011 | Nakanishi | G02B 5/223 359/359 |
| 2011/0169984 | A1 * | 7/2011 | Noguchi | H04N 5/332 348/234 |
| 2011/0187907 | A1 * | 8/2011 | Takahashi | H01L 27/146 348/302 |
| 2011/0279724 | A1 * | 11/2011 | Kajihara | H04N 5/3745 348/308 |
| 2012/0202281 | A1 * | 8/2012 | Gonzalez | C12M 21/02 435/292.1 |
| 2013/0002882 | A1 * | 1/2013 | Onozawa | H04N 5/2353 348/164 |
| 2013/0057743 | A1 * | 3/2013 | Minagawa | H04N 5/35563 348/302 |
| 2013/0182163 | A1 * | 7/2013 | Kobayashi | H01L 27/14601 348/302 |
| 2013/0188057 | A1 * | 7/2013 | Lin | H04N 5/332 348/164 |
| 2013/0242040 | A1 * | 9/2013 | Masuda | H04N 5/2254 348/36 |
| 2014/0027653 | A1 * | 1/2014 | Mori | G02B 5/22 250/458.1 |
| 2015/0130908 | A1 * | 5/2015 | Kang | G06T 7/50 348/46 |
| 2015/0163464 | A1 | 6/2015 | Egawa et al. | |
| 2015/0221691 | A1 * | 8/2015 | Watanabe | H04N 5/332 348/164 |
| 2015/0260888 | A1 * | 9/2015 | Yoshihara | G02B 5/26 359/359 |
| 2015/0268396 | A1 * | 9/2015 | Weber | G02B 5/282 359/359 |
| 2015/0287766 | A1 * | 10/2015 | Kim | H01L 27/14641 250/208.1 |
| 2015/0312491 | A1 * | 10/2015 | Egawa | H04N 5/35563 348/223.1 |
| 2015/0341573 | A1 * | 11/2015 | Matsuo | H04N 5/33 348/135 |
| 2015/0358562 | A1 * | 12/2015 | Egawa | H04N 5/343 348/250 |
| 2016/0161332 | A1 * | 6/2016 | Townsend | G02B 5/201 250/208.2 |
| 2016/0169795 | A1 * | 6/2016 | Kumagai | G01J 3/10 250/339.05 |
| 2016/0341973 | A1 * | 11/2016 | Ida | G02B 27/58 |
| 2017/0048429 | A1 * | 2/2017 | Takita | H04N 5/2253 |
| 2017/0079741 | A1 * | 3/2017 | Makinouchi | A61B 90/36 |
| 2017/0148831 | A1 | 5/2017 | Choi et al. | |
| 2017/0257546 | A1 * | 9/2017 | Shahid | H04N 5/2254 |
| 2017/0280122 | A1 * | 9/2017 | Sato | H04N 9/07 |
| 2017/0374226 | A1 * | 12/2017 | Sano | H01L 27/14612 |
| 2018/0234644 | A1 * | 8/2018 | Li | G06T 3/4015 |

OTHER PUBLICATIONS

European Patent Office, Extended European Search Report issued in EP Patent Application No. 18209505.9, dated Jun. 25, 2019, pp. 1-14.
Taiwan Intellectual Property Office, Office Action issued in TW Application No. 20180142826, dated Mar. 4, 2020, pp. 1-12.
European Patent Office, Official Action issued in EP Patent Application No. 18209505.9; dated Jun. 11, 2021, pp. 1-10.

* cited by examiner

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATIONS

This application is based on and claims the benefit of priority from Japanese Patent Application Serial No. 2017-230521 (filed on Nov. 30, 2017) and Japanese Patent Application Serial No. 2018-194303 (filed on Oct. 15, 2018), the contents of which are hereby incorporated by reference in their entirety.

TECHNICAL FIELD

The present invention relates to a solid-state imaging device, a method for driving a solid-state imaging device, and an electronic apparatus.

BACKGROUND

A solid-state imaging device (image sensors) including photoelectric conversion elements for detecting light and generating a charge is embodied in CMOS (complementary metal oxide semiconductor) image sensors, which have been in practical use. CMOS image sensors have been widely applied as parts of various electronic apparatuses such as digital cameras, video cameras, surveillance cameras, medical endoscopes, personal computers (PCs), mobile phones and other portable terminals (mobile devices).

A CMOS image sensor includes, for each pixel, a photodiode (a photoelectric conversion element) and a floating diffusion (FD) amplifier having a floating diffusion (FD). The mainstream of the reading operation in CMOS image sensors is a column parallel output processing performed by selecting a row in a pixel array and reading the pixels simultaneously in the column direction.

Each pixel of a CMOS image sensor includes, for one photodiode for example, four active elements: a transfer transistor serving as a transfer gate, a reset transistor serving as a reset gate, a source follower transistor serving as a source follower gate (an amplification gate), and a selection transistor serving as a selection gate (see, for example, Japanese Patent Application Publication No. 2005-223681).

In general, a CMOS image sensor captures color images using three primary color filters for red (R), green (G), and blue (B) or four complementary color filters for cyan, magenta, yellow, and green.

In general, each pixel in a CMOS image sensor has a filter. A CMOS image sensor includes unit RGB pixel groups arranged two-dimensionally, and each unit RGB pixel group includes four filters arranged in a square geometry, that is, a red (R) filter that mainly transmits red light, green (Gr, Gb) filters that mainly transmit green light, and a blue (B) filter that mainly transmits blue light.

Incident light on the CMOS image sensor goes through the filters and is received by photodiodes. Photodiodes receive light having a wavelength in a region (380 nm to 1,100 nm) wider than the human visible region (380 nm to 780 nm) and produce signal charges, and therefore, photodiodes may suffer from errors produced by infrared light and thus have reduced color reproduction quality. Accordingly, it is a general practice to eliminate infrared light previously by infrared cut filters (IR cut filters). However, IR cut filters attenuate visible light by approximately 10% to 20%, resulting in reduced sensitivity of the solid-state imaging device and a degraded the image quality.

To overcome this problem, a CMOS image sensor (a solid-state imaging device) including no IR cut filter has been devised (see, for example, Japanese Patent Application Publication No. 2017-139286). This CMOS image sensor includes unit RGBIR pixel groups arranged two-dimensionally, and each unit RGBIR pixel group is constituted by four pixels arranged in a square geometry, that is, an R pixel including a red (R) filter that mainly transmits red light, a G pixel including a green (G) filter that mainly transmits green light, a B pixel including a blue (B) filter that mainly transmits blue light, and a near-infrared (NIR) dedicated pixel that receives infrared light. This CMOS image sensor operates as a NIR-RGB sensor that can capture so-called NIR images and RGB images.

In this CMOS image sensor, output signals from pixels receiving infrared light are used to correct output signals from pixels receiving red, green, and blue light, thereby to achieve a high color reproduction quality without use of IR cut filters.

Further, in a CMOS image sensor including the unit RGBIR pixel groups or the unit RGB pixel groups, the four pixels in a unit pixel group may share the floating diffusion FD, the reset transistor RST-Tr, the source follower transistor SF-Tr, and the selection transistor SEL-Tr.

Further, there has been known an infrared (IR, NIR) sensor in which the four pixels in a unit pixel group are replaced with one NIR dedicated pixel having a larger pixel size.

FIG. 1 is a plan view showing a schematic arrangement of constituents of a solid-state imaging device (a CMOS image sensor) formed as a NIR-RGB sensor having unit RGBIR pixel groups. In the example shown in FIG. 1, the pixels in a unit RGBIR pixel group have the same size and capture so-called RGB images and NIR images.

FIG. 2 is a plan view showing a schematic arrangement of constituents of a solid-state imaging device (a CMOS image sensor) formed as a NIR sensor. In the example shown in FIG. 2, the NIR dedicated pixel has a larger pixel size than the NIR-RGB sensor.

The CMOS image sensor of FIG. 1 formed as a conventional NIR-RGB sensor is advantageous in that it is possible to capture RGB images and NIR images with one sensor. However, This CMOS image sensor is disadvantageous in that its resolution for the infrared light is about the same as that of RGB pixels but its NIR sensitivity is low (approximately one fourth of the normal sensitivity).

The CMOS image sensor of FIG. 2 formed as a conventional NIR sensor is disadvantageous in that its NIR sensitivity is high (approximately four times as high) but it cannot capture color images of visible light such as RGB images.

SUMMARY

One object of the present invention is to provide a solid-state imaging device that can capture visible light images such as RGB images and infrared images such as NIR images and maintain a high light-receiving sensitivity for infrared light, a method of driving such a solid-state imaging device, and an electronic apparatus.

A solid-state imaging device according to the first aspect of the present invention comprises: a pixel part having unit pixel groups arranged therein, the unit pixel groups each including a plurality of pixels at least for visible light that perform photoelectric conversion; and a reading part for reading pixel signals from the pixel part, wherein the plurality of pixels for visible light have a light-receiving sensitivity for infrared light, and in an infrared reading mode, the reading part is capable of adding together signals for infrared light read from the plurality of pixels for visible light.

The second aspect of the present invention resides in a method of driving a solid-state imaging device, the solid-state imaging device including a pixel part having unit pixel groups arranged therein, the unit pixel groups each including a plurality of pixels at least for visible light that perform photoelectric conversion, the plurality of pixels for visible light having a light-receiving sensitivity for infrared light, the method comprising the steps of: in an infrared reading mode, reading signals for infrared light from the plurality of pixels for visible light and adding together the read signals for infrared light.

An electronic apparatus according to the third aspect of the present invention comprises: a solid-state imaging device; and an optical system for forming a subject image on the solid-state imaging device, wherein the solid-state imaging device includes: a pixel part having unit pixel groups arranged therein, the unit pixel groups each including a plurality of pixels at least for visible light that perform photoelectric conversion; and a reading part for reading pixel signals from the pixel part, the plurality of pixels for visible light have a light-receiving sensitivity for infrared light, and in an infrared reading mode, the reading part is capable of adding together signals for infrared light read from the plurality of pixels for visible light.

Advantages

According to the present invention, it is possible to capture visible light images such as RGB images and infrared images such as NIR images and maintain a high light-receiving sensitivity for infrared light.

DESCRIPTION OF THE EMBODIMENTS

Embodiments of the present invention will be hereinafter described with reference to the drawings.

First Embodiment

Figure 1:
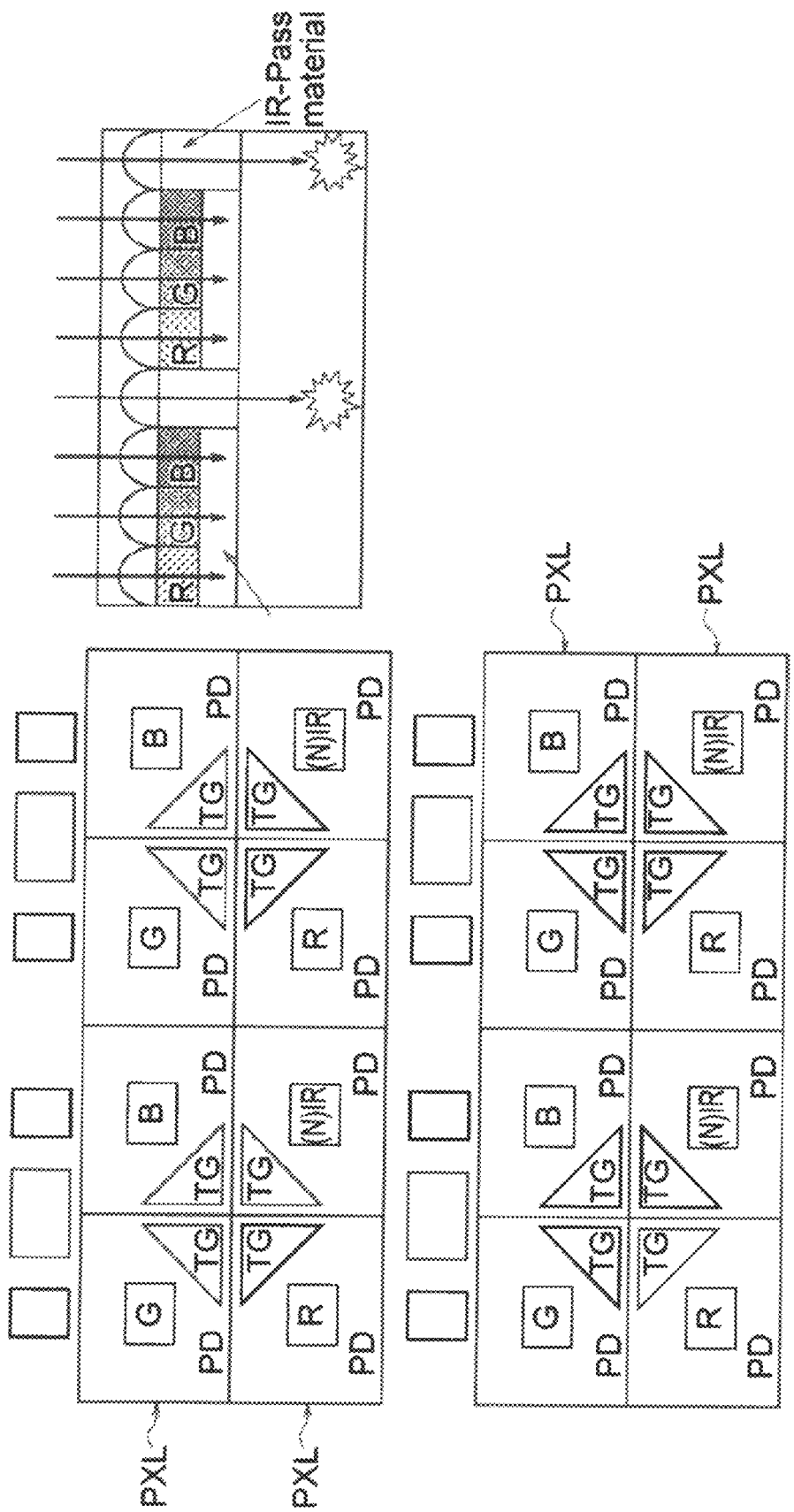
FIG. 1 is a plan view showing a schematic arrangement of constituents of a solid-state imaging device (a CMOS image sensor) formed as a NIR-RGB sensor having unit RGBIR pixel groups.
Figure 2:
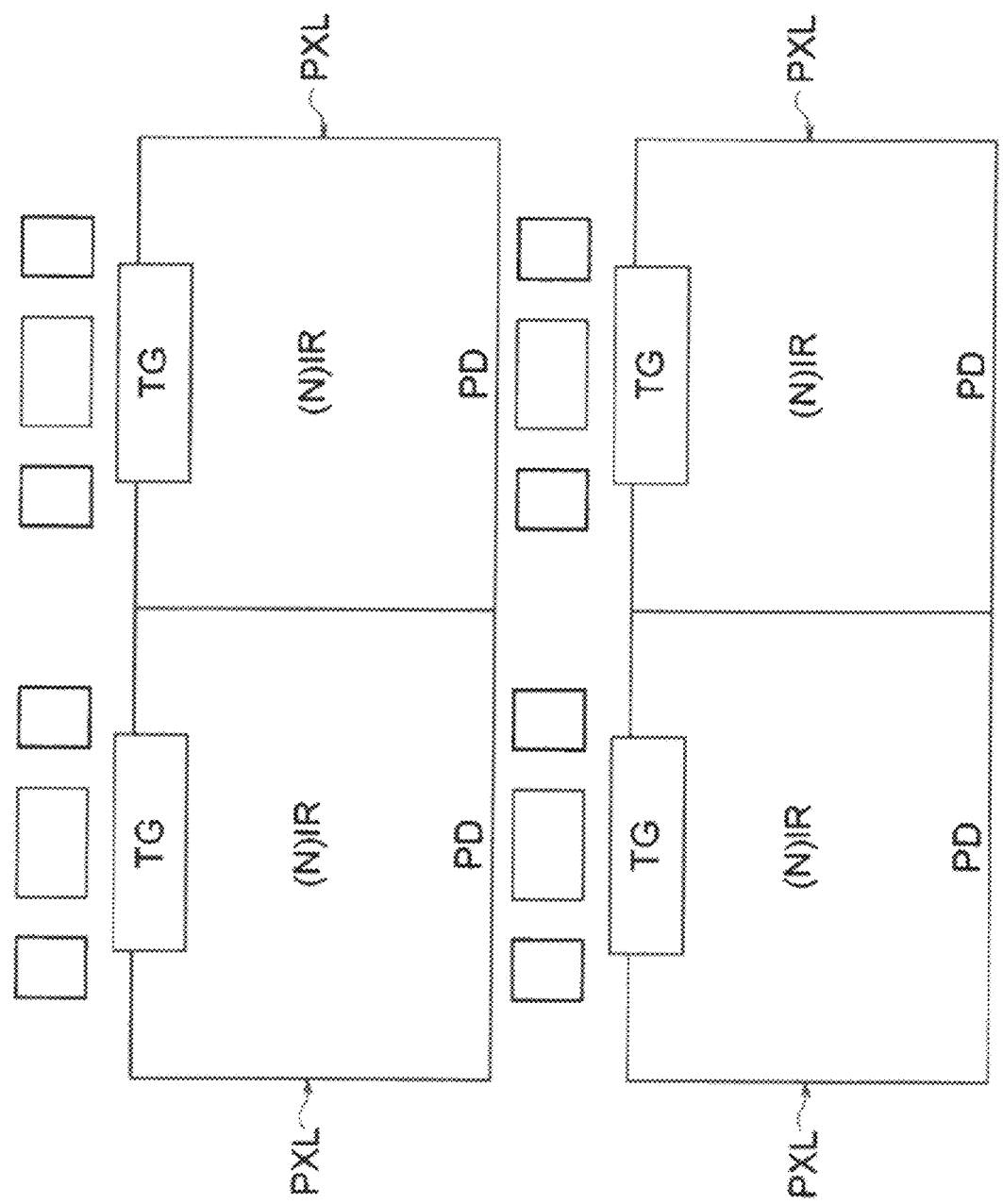
FIG. 2 is a plan view showing a schematic arrangement of constituents of a solid-state imaging device (a CMOS image sensor) formed as a NIR sensor.
Figure 3:
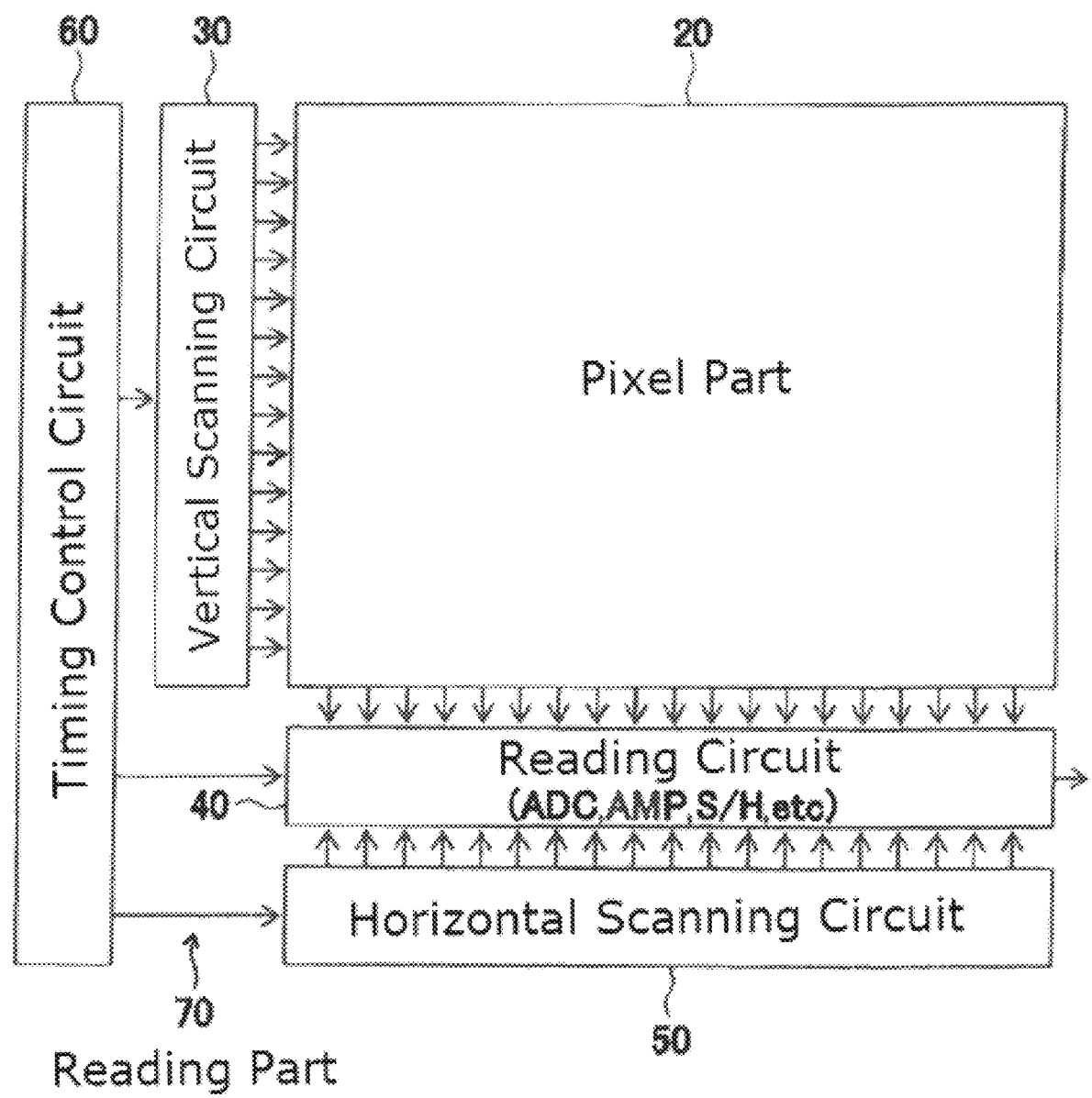
FIG. 3 is a block diagram showing a configuration of a solid-state imaging device according to a first embodiment of the present invention.

FIG. 3 is a block diagram showing a configuration of a solid-state imaging device according to a first embodiment of the present invention. In this embodiment, the solid-state imaging device 10 is constituted by for example a CMOS image sensor.

As shown in FIG. 3, the solid-state imaging device 10 is constituted mainly by a pixel part 20 serving as an image capturing part, a vertical scanning circuit (a row scanning circuit) 30, a reading circuit (a column reading circuit) 40, a horizontal scanning circuit (a column scanning circuit) 50, and a timing control circuit 60. Among these components, for example, the vertical scanning circuit 30, the reading circuit 40, the horizontal scanning circuit 50, and the timing control circuit 60 constitute the reading part 70 for reading out pixel signals.

In the solid-state imaging device 10 according to the first embodiment, the pixel part 20 includes unit pixel groups each including a plurality of pixels (also referred to as "color pixels") for visible light that perform photoelectric conversion, so as to make it possible to capture visible light images formed of RGB light and infrared images formed of NIR light and maintain a high light-receiving sensitivity for infrared light. The plurality of pixels (color pixels) for visible light has the light-receiving sensitivity for infrared light. In an infrared reading mode MIRRD, the reading part 70 is capable of adding together signals for infrared light read from the plurality of color pixels. In the first embodiment, the wavelength of the infrared light is 800 nm or longer. It is also possible that the color pixels are configured such that the reading part 70 can read color pixel signals for the visible region and infrared pixel signals for the infrared region concurrently.

In the first embodiment, the unit pixel groups each include a plurality of photoelectric conversion parts configured to photoelectrically convert the light incident from one surface side and corresponding to a plurality of visible light wavelength bands (colors). The plurality of photoelectric conversion parts include a red (R) photoelectric conversion part corresponding to the red (R) region, a first green (Gb) photoelectric conversion part and a second green (Gr) photoelectric conversion part corresponding to the green (Gb, Gr) regions, and a blue (B) photoelectric conversion part corresponding to the blue (B) region.

In a first mode MOD1, the reading part 70 can output, without any processing, signals read from the first green (Gb) photoelectric conversion part, the blue (B) photoelectric conversion part, the red (R) photoelectric conversion part, and the second green (Gr) photoelectric conversion part. In a second mode MOD2 including the infrared reading mode, the reading part 70 can add together signals read from the first green (Gb) photoelectric conversion part, the blue (B) photoelectric conversion part, the red (R) photoelectric conversion part, and the second green (Gr) photoelectric conversion part. In the first embodiment, basically, the first mode MOD1 refers to a red (R) green (G) blue (B) image capturing mode, and the second mode MOD2 refers to an infrared (IR, NIR) image capturing mode. In the first embodiment, the unit pixel groups are formed as unit RGB pixel groups.

A description will be hereinafter given of an outline of the configurations and functions of the parts of the solid-state imaging device 10 and then details of configurations and arrangement of the pixels.

Configurations of Pixel Part 20 and Pixels PXL

In the pixel part 20, a plurality of pixels each including a photodiode (a photoelectric conversion part) and an in-pixel amplifier are arranged in a two-dimensional matrix comprised of N rows and M columns.

Figure 4:
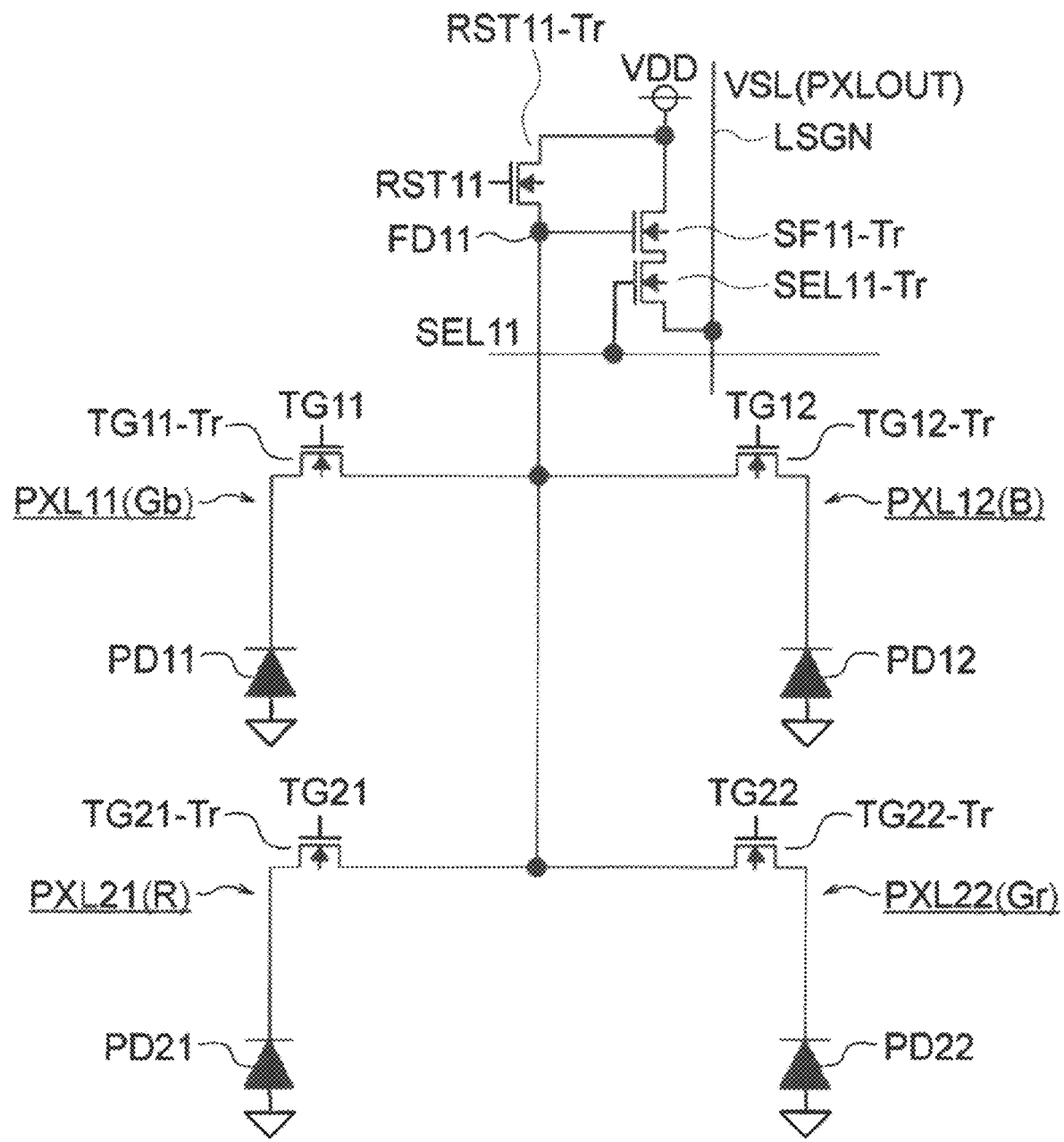
FIG. 4 is a circuit diagram showing a configuration in which one floating diffusion is shared by four pixels in a pixel part of the solid-state imaging device according to the first embodiment of the present invention.

FIG. 4 is a circuit diagram showing a configuration in which one floating diffusion is shared by four pixels in a pixel part of the solid-state imaging device according to the first embodiment of the present invention.

In FIG. 4, the pixel part 20 includes four pixels PXL11, PXL12, PXL21, PXL22 arranged in a square geometry having two rows and two columns.

The pixel PXL11 includes a photodiode PD11 and a transfer transistor TG11-Tr.

The pixel PXL12 includes a photodiode PD12 and a transfer transistor TG12-Tr.

The pixel PXL21 includes a photodiode PD21 and a transfer transistor TG21-Tr.

The pixel PXL22 includes a photodiode PD22 and a transfer transistor TG22-Tr.

In the pixel part 20, the four pixels PXL11, PXL12, PXL21, PXL22 share a floating diffusion FD11, a reset transistor RST11-Tr, a source follower transistor SF11-Tr, and a selection transistor SEL11-Tr.

In such a four-pixel sharing configuration, when the unit pixel groups are arranged in the Bayer array, the pixel PXL11 is formed as a Gb pixel, the pixel PXL12 is formed as a B pixel, the pixel PXL21 is formed as an R pixel, and the pixel PXL22 is formed as a Gr pixel. For example, the photodiode PD11 of the pixel PXL11 operates as the first green (Gb) photoelectric conversion part, the photodiode PD12 of the pixel PXL12 operates as the blue (B) photoelectric conversion part, the photodiode PD21 of the pixel PXL21 operates as the red (R) photoelectric conversion part, and the photodiode PD22 of the pixel PXL22 operates as the second green (Gr) photoelectric conversion part.

In general, the sensitivity of the photodiode PD of each pixel to reach saturation is different for each colors (light wavelength bands). For example, the photodiodes PD11, PD of the G pixels have higher sensitivity than the photodiodes PD12 of the B pixel and the photodiode PD21 of the R pixel.

The photodiodes PD11, PD12, PD21, PD22 are constituted by, for example, a pinned photodiode (PPD). On the substrate surface for forming the photodiodes PD11, PD12, PD21, PD22, there is a surface level due to dangling bonds or other defects, and therefore, a lot of charges (dark current) are generated due to heat energy, so that a correct signal fails to be read out. In a pinned photodiode (PPD), a charge accumulation part of the photodiode PD can be pinned in the substrate to reduce mixing of the dark current into signals.

The photodiodes PD11, PD12, PD21, PD22 generate signal charges (here, electrons) in an amount in accordance with the quantity of the incident light and accumulates the same. A description will be hereinafter given of a case where the signal charges are electrons and each transistor is an n-type transistor. However, it is also possible that the signal charges are holes or each transistor is a p-type transistor.

The transfer transistor TG11-Tr is connected between the photodiode PD11 and the floating diffusion FD11 and controlled through a control line (or a control signal) TG11. Under control of the reading part 70, the transfer transistor TG11-Tr is selected and enters a conductive state in a period in which the control line TG11 is at a predetermined high (H) level and transfers charges (electrons) photoelectrically converted and accumulated in the photodiode PD11 to the floating diffusion FD11.

The transfer transistor TG12-Tr is connected between the photodiode PD12 and the floating diffusion FD11 and controlled through a control line (or a control signal) TG12. Under control of the reading part 70, the transfer transistor TG12-Tr is selected and enters a conductive state in a period in which the control line TG12 is at a predetermined high (H) level and transfers charges (electrons) photoelectrically converted and accumulated in the photodiode PD12 to the floating diffusion FD11.

The transfer transistor TG21-Tr is connected between the photodiode PD21 and the floating diffusion FD11 and controlled through a control line (or a control signal) TG21. Under control of the reading part 70, the transfer transistor TG21-Tr is selected and enters a conductive state in a period in which the control line TG21 is at a predetermined high (H) level and transfers charges (electrons) photoelectrically converted and accumulated in the photodiode PD21 to the floating diffusion FD11.

The transfer transistor TG22-Tr is connected between the photodiode PD22 and the floating diffusion FD11 and controlled through a control line (or a control signal) TG22. Under control of the reading part 70, the transfer transistor TG22-Tr is selected and enters a conductive state in a period in which the control line TG22 is at a predetermined high (H) level and transfers charges (electrons) photoelectrically converted and accumulated in the photodiode PD22 to the floating diffusion FD11.

As shown in FIG. 4, the reset transistor RST11-Tr is connected between a power supply line VDD (or a power supply potential) and the floating diffusion FD11 and controlled through a control line (or a control signal) RST11. It is also possible that the reset transistor RST11-Tr is connected between a power supply line VRst other than the power supply line VDD and the floating diffusion FD and controlled through a control line (or a control signal) RST11. Under control of the reading part 70, during a scanning operation for reading for example, the reset transistor RST11-Tr is selected and enters a conductive state in a period in which the control line RST11 is at the H level and resets the floating diffusion FD11 to the potential of the power supply line VDD (or VRst).

The source follower transistor SF11-Tr and the selection transistor SEL11-Tr are connected in series between the power supply line VDD and a vertical signal line LSGN. The floating diffusion FD11 is connected to the gate of the source follower transistor SF11-Tr, and the selection transistor SEL11-Tr is controlled through a control line (or a control signal) SEL11. The selection transistor SEL11-Tr is selected and enters a conductive state in a period in which the control line SEL11 is at the H level. Thus, the source follower transistor SF11-Tr outputs, to the vertical signal line LSGN, a read-out voltage (signal) of a column output VSL(PIXOUT) converted from the charges of the floating diffusion FD11 with a gain corresponding to a quantity of the charges (the potential).

Since the pixel part 20 includes the pixels PXL arranged in N rows and M columns, there are N each of control lines SEL, RST, TG and M vertical signal lines LSGN. In FIG. 3, each of the control lines (or the control signals) SEL, RST, TG is represented as one row-scanning control line.

The vertical scanning circuit 30 drives the pixels through the row-scanning control lines in shutter rows and reading rows in accordance with the control of the timing control circuit 60. Further, the vertical scanning circuit 30 outputs, according to address signals, row selection signals for row addresses of the reading rows from which signals are read out and the shutter rows in which the charges accumulated in the photodiodes PD are reset.

In a normal pixel reading operation, a shutter scan and then a reading scan are performed by driving of the pixels by the vertical scanning circuit 30 of the reading part 70.

The reading circuit 40 includes a plurality of column signal processing circuits (not shown) arranged corresponding to the column outputs of the pixel part 20, and the reading circuit 40 may be configured such that the plurality of column signal processing circuits can perform column parallel processing.

The reading circuit 40 may include a correlated double sampling (CDS) circuit, an analog-digital converter (ADC), an amplifier (AMP), a sample/hold (S/H) circuit, and the like.

Figure 5A:
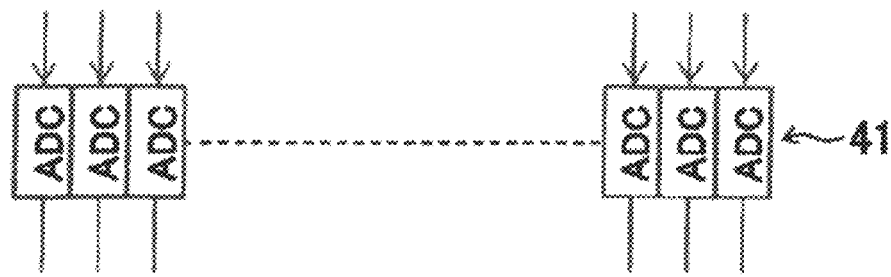
FIG. 5A shows a configuration of a column signal processing circuit in a reading circuit according to the embodiment.
Figure 5B:
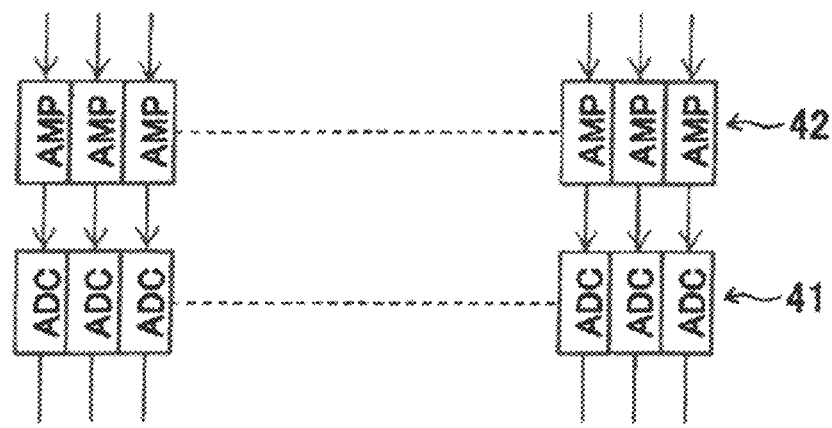
FIG. 5B shows a configuration of the column signal processing circuit in the reading circuit according to the embodiment.
Figure 5C:
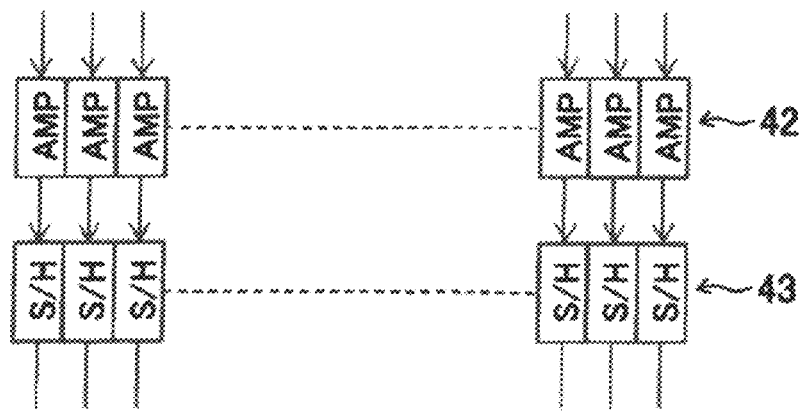
FIG. 5C shows a configuration of the column signal processing circuit in the reading circuit according to the embodiment.

Thus, as shown in FIG. 5A for example, the reading circuit 40 may include ADCs 41 for converting the read-out signals VSL from the column outputs of the pixel part 20 into digital signals. Alternatively, as shown in FIG. 5B for example, the reading circuit 40 may include amplifiers (AMPs) 42 for amplifying the read-out signals VSL from the column outputs of the pixel part 20. It is also possible that, as shown in FIG. 5C for example, the reading circuit 40 may include sample/hold (S/H) circuits 43 for sampling/holding the read-out signals VSL from the column outputs of the pixel part 20.

The horizontal scanning circuit 50 scans the signals processed in the plurality of column signal processing circuits of the reading circuit 40 such as ADCs, transfers the signals in a horizontal direction, and outputs the signals to a signal processing circuit (not shown).

The timing control circuit 60 generates timing signals required for signal processing in the pixel part 20, the vertical scanning circuit 30, the reading circuit 40, the horizontal scanning circuit 50, and the like.

The above description explained an outline of the configurations and functions of the parts of the solid-state imaging device 10. Next, a detailed description will be given of the arrangement of the pixels according to the first embodiment.

Figure 6:
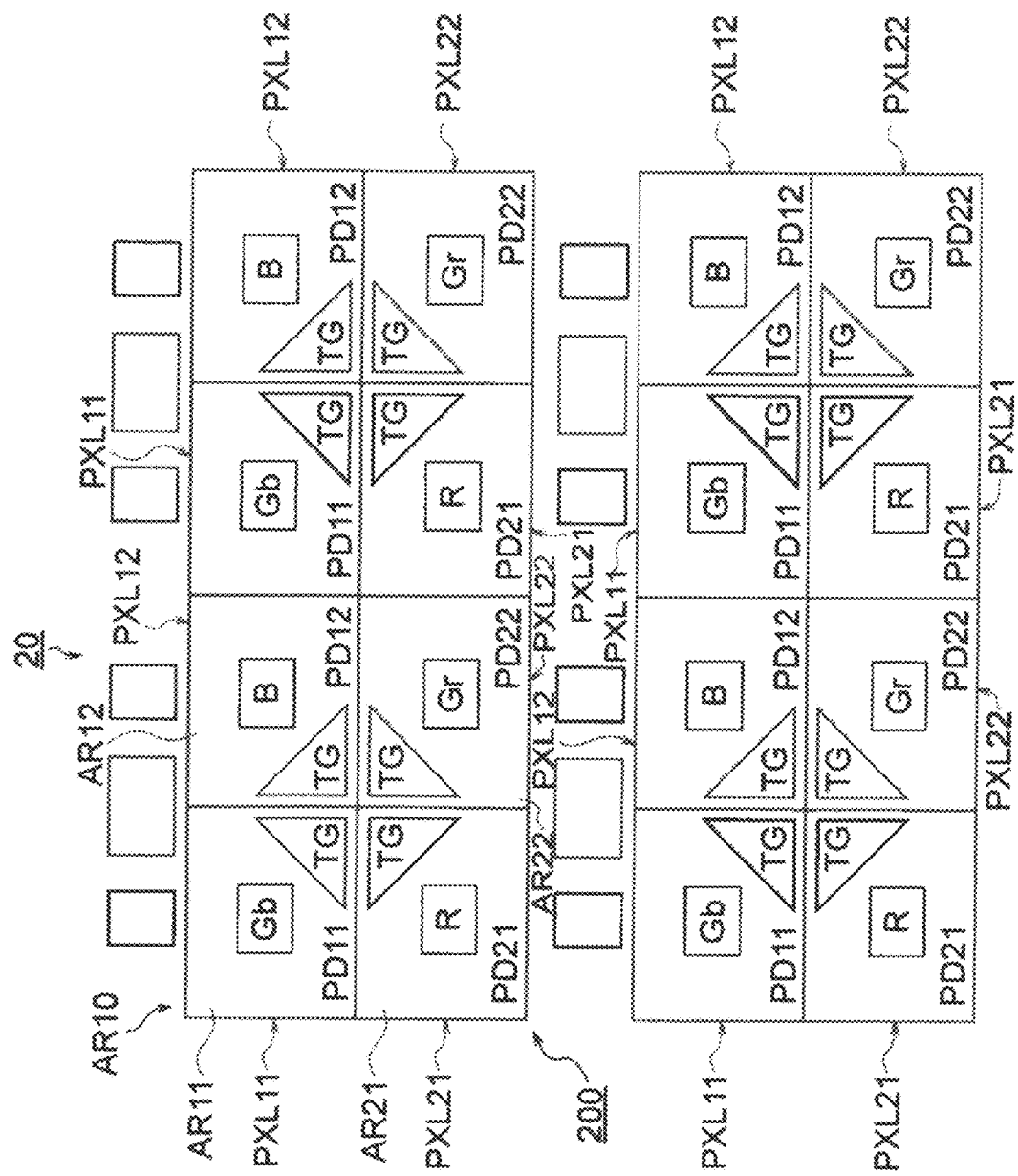
FIG. 6 is a plan view showing a schematic arrangement of constituents of the solid-state imaging device (the CMOS image sensor) having unit RGB pixel groups according to the first embodiment of the present invention.

FIG. 6 is a plan view showing a schematic arrangement of constituents of the solid-state imaging device (the CMOS image sensor) having the unit pixel groups according to the first embodiment of the present invention.

FIG. 6 shows the circuit of FIG. 4 in a plan view, and the pixel part 20 includes four pixels PXL11, PXL12, PXL21, PXL22 arranged in a square geometry having two rows and two columns. More specifically, a rectangular arrangement region 10 includes arrangement regions AR11, AR12, AR21, AR22 having the four pixels PXL11, PXL12, PXL21, PXL22 placed therein, respectively, and these four arrangement regions are in a square geometry having two rows and two columns.

The pixel part 20 shown in FIG. 6 has the four-pixel sharing configuration with the square arrangement, in which the pixel PXL11 is formed as a Gb pixel, the pixel PXL12 is formed as a B pixel, the pixel PXL21 is formed as an R pixel, and the pixel PXL22 is formed as a Gr pixel.

Further, in the pixel part 20, the four pixels PXL11, PXL12, PXL21, PXL22 share the floating diffusion FD11, the reset transistor RST11-Tr, the source follower transistor SF11-Tr, and the selection transistor SEL11-Tr.

Figure 7:
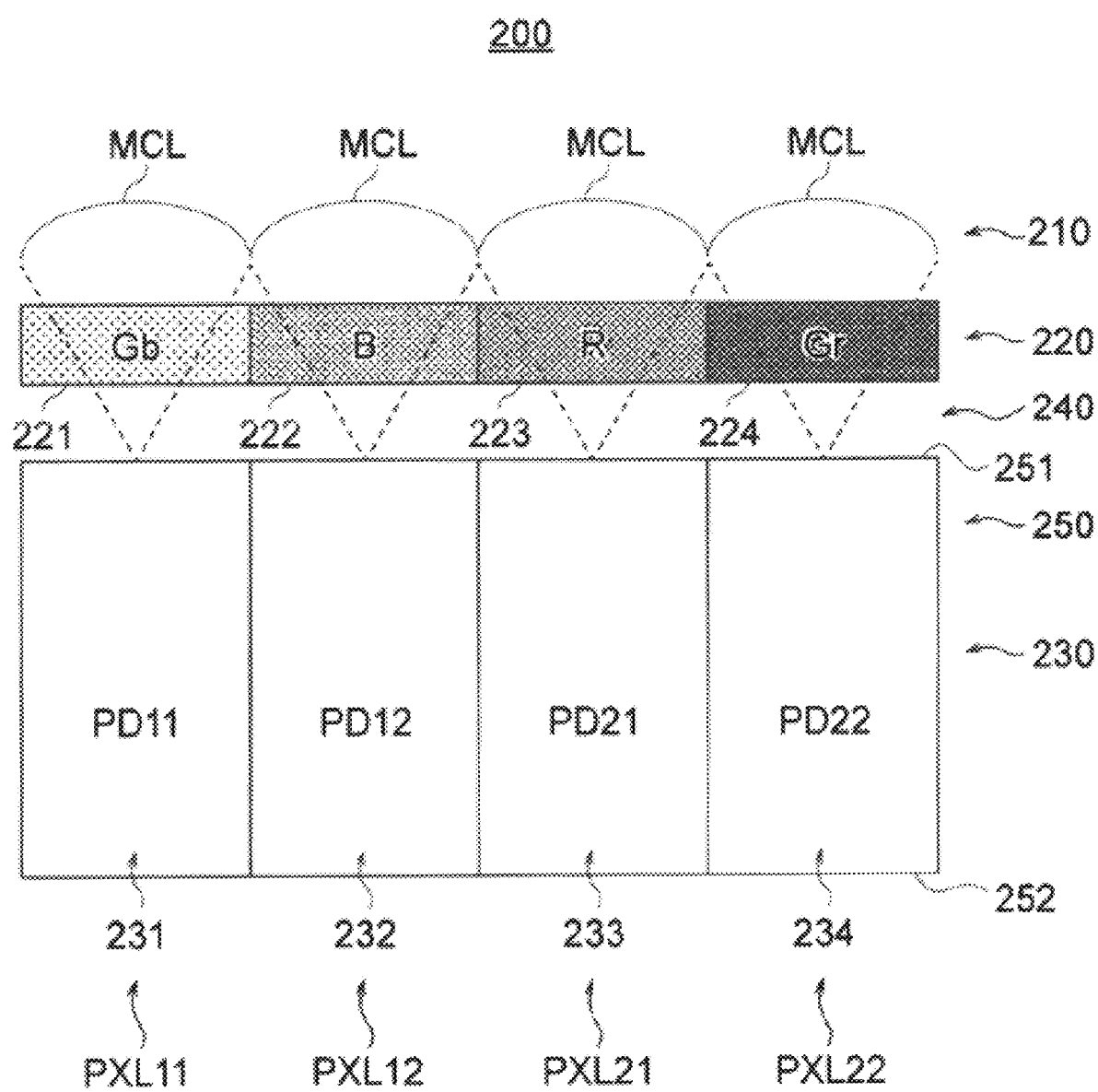
FIG. 7 is a simplified sectional view schematically showing a configuration of a unit pixel group in the solid-state imaging device according to the first embodiment of the present invention.

FIG. 7 is a simplified sectional view schematically showing a configuration of the unit pixel group in the solid-state imaging device according to the first embodiment of the present invention. For easier understanding, FIG. 7 shows the constituents of the first green (Gb) pixel PXL11, the blue (B) pixel PXL12, the red (R) pixel PXL21, and the second green (Gr) pixel PXL22 to be arranged in a line for descriptive purposes.

The unit RGB pixel group 200 is composed mainly of a microlens array 210, a color filter array 220, a photodiode array 230 as the photoelectric conversion parts, and a flat layer 240.

The color filter array 220 is segmented into a first green (Gb) filter region 221, a blue (B) filter region 222, a red (R) filter region 223, and a second green (Gr) filter region 224 so as to form the color pixels. The microlenses MCL of the microlens array 210 are arranged on the light incidence side of the first green (Gb) filter region 221, the blue (B) filter region 222, the red (R) filter region 223, and the second green (Gr) filter region 224.

The photodiodes PD11, PD12, PD21, PD22 serving as the photoelectric conversion parts are embedded in a semiconductor substrate 250 having a first substrate surface 251 and a second substrate surface 252 opposite to the first substrate surface 251, and these photodiodes are capable of photoelectric conversion of received light and accumulation of charges.

The photodiodes PD11, PD12, PD21, PD22 of the photodiode array 230 are adjacent to the color filter array 220 on the first substrate surface 251 side (the back surface side) with a medium of the flat layer 240. In the second substrate surface 252 side (the front surface side) of the photodiodes PD11, PD12, PD21, PD22, there are formed output parts 231, 232, 233, 234 including output transistors for outputting signals corresponding to the charges that are photoelectrically converted and accumulated.

The color pixels in the unit RGB pixel group 200 configured as described above not only have an inherent particular responsibility in a visible range (400 nm to 700 nm), but also have a high responsibility in a near-infrared (NIR) region (800 nm to 1,000 nm).

In the color filter array 220 according to the first embodiment, the color (visible light) region extends to the starting area (e.g., 850 nm) of the near-infrared region, and the red filter, the green filter, and the blue filter have different transmittances that are as high as 90% or higher in the near-infrared region.

In the first embodiment, the photodiode PD11 serving as the first green (Gb) photoelectric conversion part, the photodiode PD12 serving as the blue (B) photoelectric conversion part, the photodiode PD21 serving as the red (R) photoelectric conversion part, and the photodiode PD22 serving as the second green (Gr) photoelectric conversion part also operate as infrared (NIR) photoelectric conversion parts.

Figure 8:
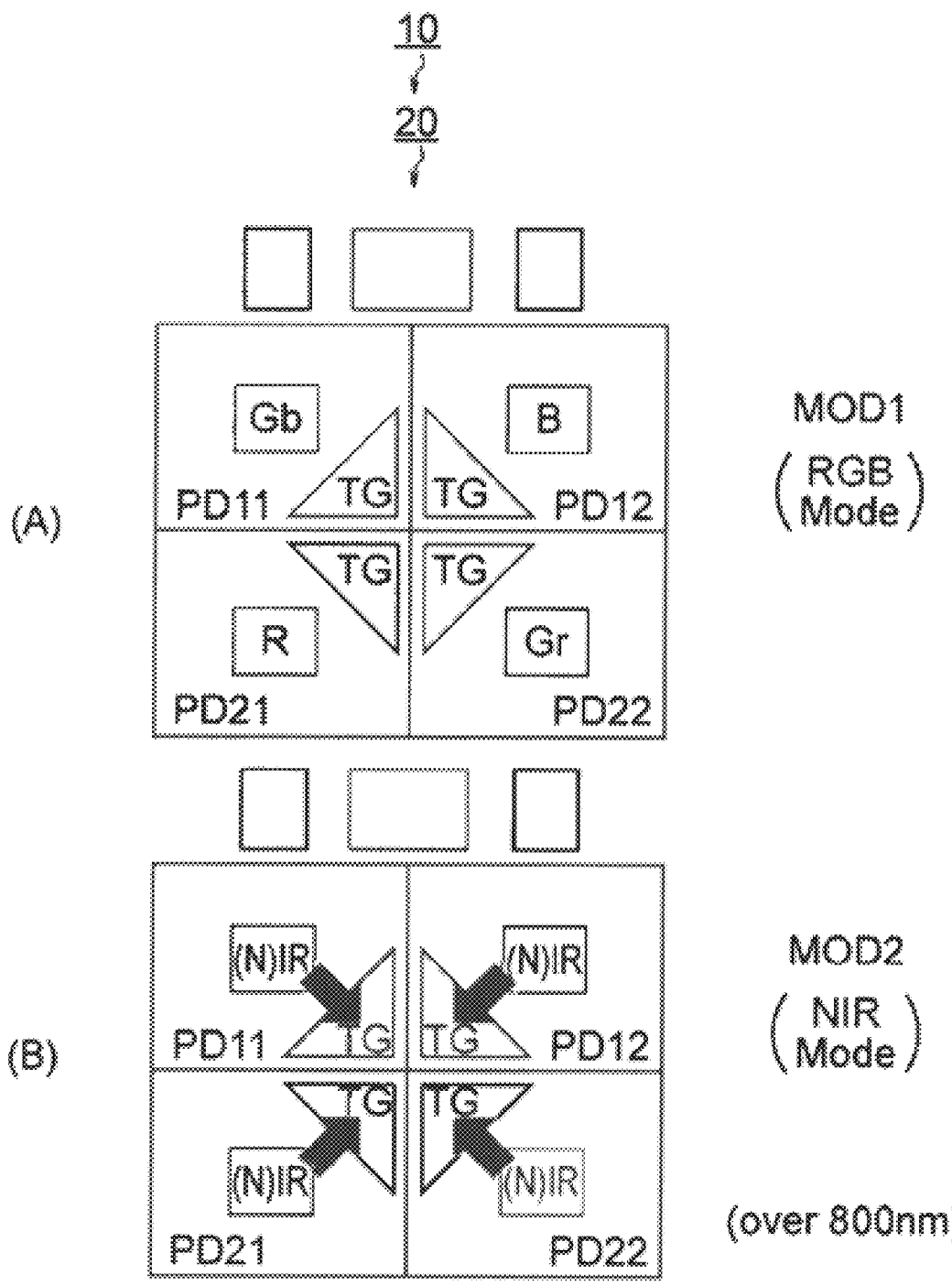
FIG. 8 illustrates a reading operation in a first mode and a reading operation in a second mode performed in the solid-state imaging device according to the first embodiment of the present invention.

FIG. 8 illustrates a reading operation in a first mode and a reading operation in a second mode performed in the solid-state imaging device 10 according to the first embodiment.

In the first mode MOD1 (the RGB image capturing mode), under control of the reading part 70, signals read from the photodiode PD11 serving as the first green (Gb) photoelectric conversion part, the photodiode PD12 serving as the blue (B) photoelectric conversion part, the photodiode PD21 serving as the red (R) photoelectric conversion part, and the photodiode PD22 serving as the second green (Gr) photoelectric conversion part are output without any processing, as shown in Part (A) of FIG. 8.

In the second mode MOD2 (the NIR image capturing mode), under control of the reading part 70, a plurality (e.g., all) of signals read from the photodiode PD11 serving as the first green (Gb) photoelectric conversion part, the photodiode PD12 serving as the blue (B) photoelectric conversion part, the photodiode PD21 serving as the red (R) photoelectric conversion part, and the photodiode PD22 serving as the second green (Gr) photoelectric conversion part can be added together, as shown in Part (B) of FIG. 8.

Thus, the solid-state imaging device 10 according to the first embodiment can capture RGB images and NIR images and maintain a high NIR sensitivity.

As described above, in the solid-state imaging device 10 according to the first embodiment, the pixel part 20 includes the unit RGB pixel groups 200 having a plurality of color pixels for visible light that perform photoelectric conversion. The plurality of color (RGB) pixels have light-receiving sensitivity for infrared light. In an infrared reading mode MIRRD, the reading part 70 is capable of adding together signals for infrared light read from the plurality of color pixels. For example, in the first mode MOD1 (the RGB image capturing mode), under control of the reading part 70, signals read from the Gb pixel PXL11 including the photodiode PD11 serving as the first green (Gb) photoelectric conversion part, the B pixel PXL12 including the photodiode PD12 serving as the blue (B) photoelectric conversion part, the R pixel PXL21 including the photodiode PD21 serving as the red (R) photoelectric conversion part, and the Gr pixel PXL22 including the photodiode PD22 serving as the second green (Gr) photoelectric conversion part are output without any processing. In the second mode MOD2 (the NIR image capturing mode) including the infrared reading mode MIRRD, under control of the reading part 70, a plurality (e.g., all) of signals read from the Gb pixel PXL11 including the photodiode PD11 serving as the first green (Gb) photoelectric conversion part, the B pixel PXL12 including the photodiode PD12 serving as the blue (B) photoelectric conversion part, the R pixel PXL21 including the photodiode PD21 serving as the red (R) photoelectric conversion part, and the Gr pixel PXL22 including the photodiode PD22 serving as the second green (Gr) photoelectric conversion part can be added together.

The solid-state imaging device 10 according to the first embodiment as described above can capture visible light images such as RGB images and infrared images such as NIR images and maintain a high light-receiving sensitivity for infrared light. For example, a surveillance camera can be provided with desired characteristics including a higher sensitivity in the near-infrared (NIR) region. Further, in the near-infrared (NIR) region having a wavelength of 800 nm or longer, NIR images can be captured with a high sensitivity that does not lower the resolution of the pixels.

Second Embodiment

Figure 9:
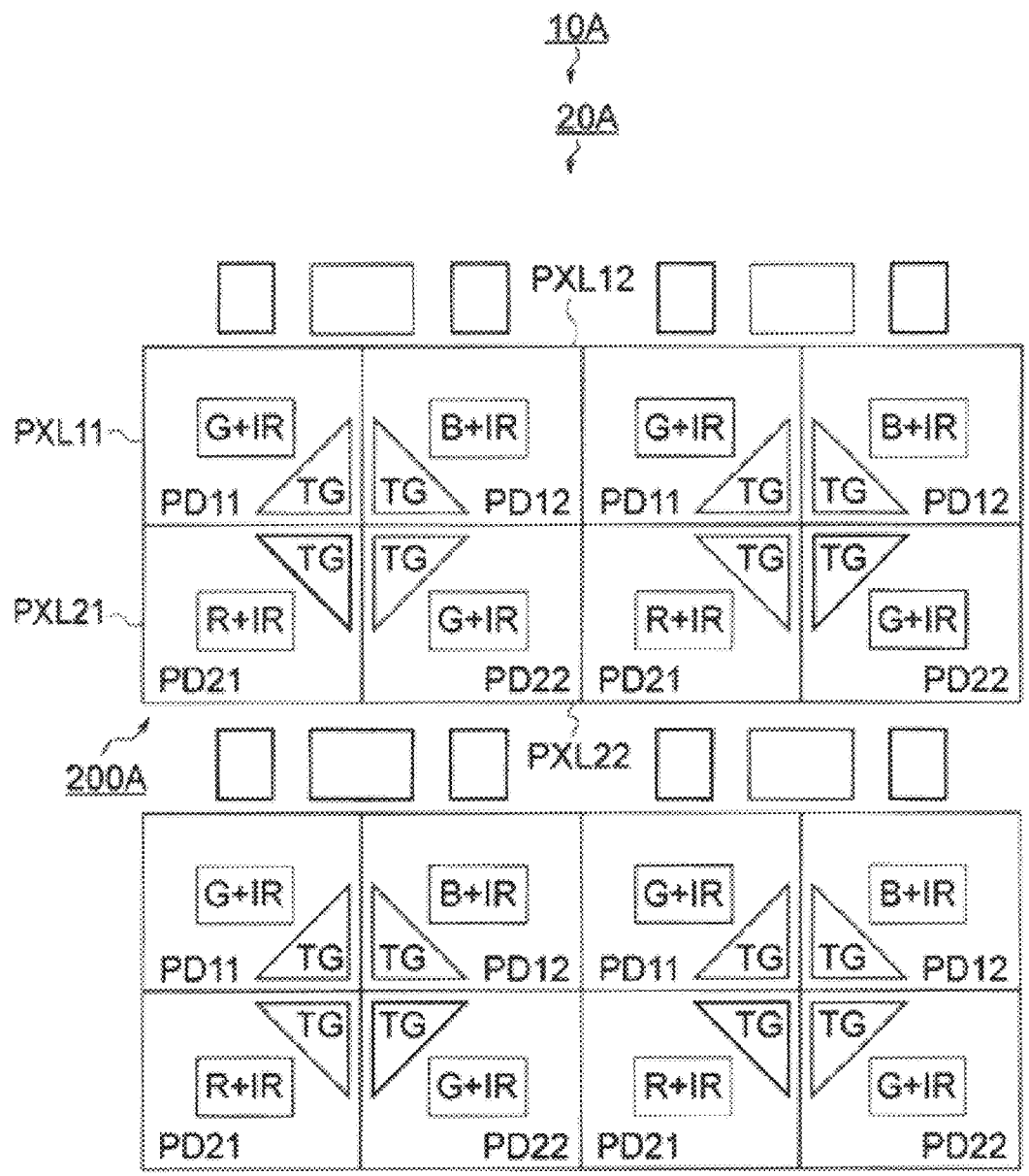
FIG. 9 is a plan view showing a schematic arrangement of constituents of a solid-state imaging device (a CMOS image sensor) having unit pixel groups according to a second embodiment of the present invention.

FIG. 9 illustrates a reading operation in the second mode performed in the solid-state imaging device according to the second embodiment of the present invention.

The second embodiment differs from the first embodiment in the following points. In the second embodiment, the reading part 70 can read (capture) the color pixel signals (RGB) in the visible region and the infrared pixel signals (NIR) in the infrared region concurrently from the Gb pixel PXL11 including the photodiode PD11 serving as the first green (Gb) photoelectric conversion part, the B pixel PXL12 including the photodiode PD12 serving as the blue (B) photoelectric conversion part, the R pixel PXL21 including the photodiode PD21 serving as the red (R) photoelectric conversion part, and the Gr pixel PXL22 including the photodiode PD22 serving as the second green (Gr) photoelectric conversion part are output without any processing.

The solid-state imaging device 10A according to the second embodiment can capture pixel signals for the visible region and the near-infrared (NIR) region of 800 nm or shorter for example, with the Gb pixel PXL11, the B pixel PXL12, the R pixel PXL21, and the Gr pixel PXL22, thereby to capture color images including the near-infrared (NIR) region.

The reading part 70 reads color pixel signals (G) and infrared pixel signals (NIR) for the infrared region concurrently from the Gb pixel PXL11 including the photodiode PD11 serving as the first green (Gb) photoelectric conversion part (G+NIR).

The reading part 70 reads color pixel signals (B) and infrared pixel signals (NIR) for the infrared region concurrently from the B pixel PXL12 including the photodiode PD12 serving as the blue (B) photoelectric conversion part (B+NIR).

The reading part 70 reads color pixel signals (R) and infrared pixel signals (NIR) for the infrared region concurrently from the R pixel PXL21 including the photodiode PD21 serving as the red (R) photoelectric conversion part (R+NIR).

The reading part 70 reads color pixel signals (G) and infrared pixel signals (NIR) for the infrared region concurrently from the Gr pixel PXL22 including the photodiode PD22 serving as the second green (Gr) photoelectric conversion part (G+NIR).

The second embodiment makes it possible not only to obtain the same effect as the first embodiment, but also to capture colored NIR images which can show, for example, a vein and an artery in a distinguishable manner. Since the solid-state imaging device 10A can capture colored infrared images, a vein and an artery of a human, for example, can be imaged with different colors in this region, thus achieving a higher accuracy and a higher security level of biometric authentication (on a palm of a hand, a retina, or others). Therefore, the solid-state imaging device 10A according to the second embodiment is effective in the biometric authentication technique such as vein, artery, or iris authentication.

Third Embodiment

Figure 10:
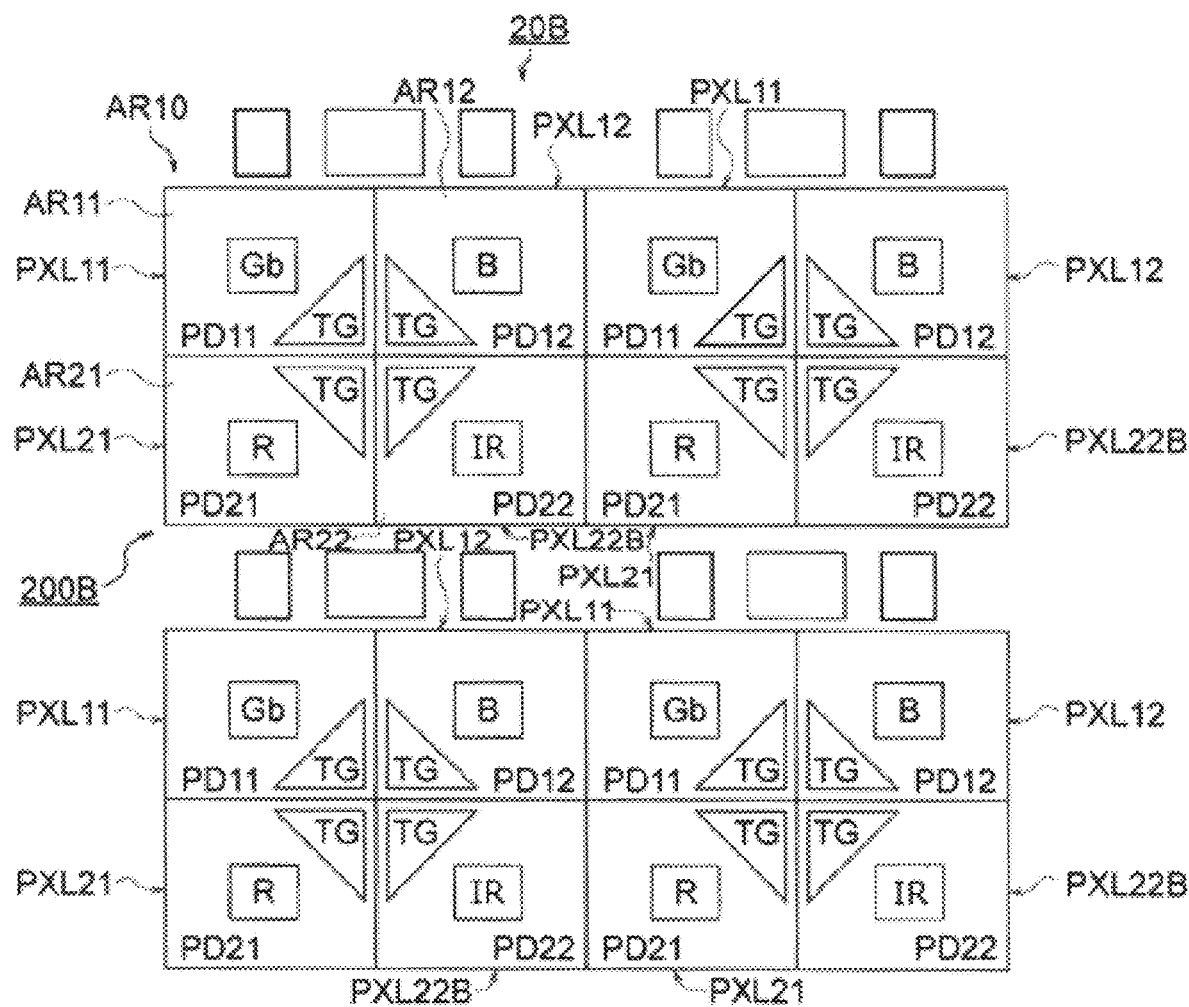
FIG. 10 is a plan view showing a schematic arrangement of constituents of a solid-state imaging device (a CMOS image sensor) having unit pixel groups according to a third embodiment of the present invention.
Figure 11:
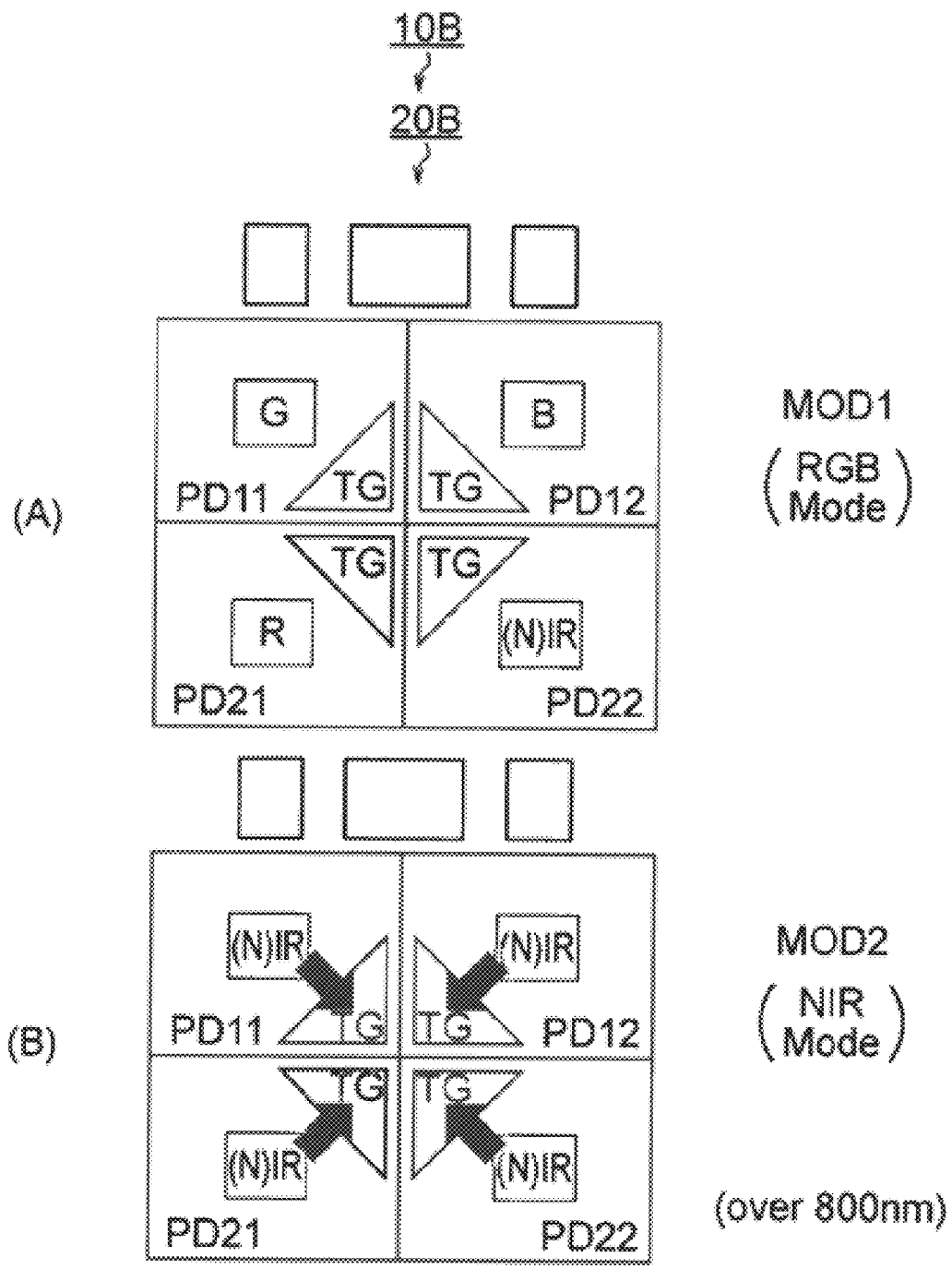
FIG. 11 illustrates a reading operation in a first mode and a reading operation in a second mode performed in the solid-state imaging device according to the third embodiment of the present invention.

FIG. 10 is a plan view showing a schematic arrangement of constituents of the solid-state imaging device (the CMOS image sensor) having the unit pixel groups according to the third embodiment of the present invention. FIG. 11 illustrates a reading operation in a first mode and a reading operation in a second mode performed in the solid-state imaging device according to the third embodiment of the present invention.

The third embodiment differs from the first embodiment in the following points. The unit pixel groups 200B in the third embodiment are each formed as a unit RGBIR pixel group in which the filter of the pixel PXL22 placed in the arrangement region AR22 is replaced with an infrared-dedicated pixel PXL22B including an infrared (NIR) photoelectric conversion part for receiving infrared light.

In the first mode MOD1, the reading part 70 can output, without any processing, signals read from the G pixel PXL11 including the photodiode PD11 serving as the green photoelectric conversion part, the B pixel PXL12 including the photodiode PD12 serving as the blue photoelectric conversion part, and the R pixel PXL21 including the photodiode PD21 serving as the red photoelectric conversion part. Alternatively, in the first mode MOD1, the reading part 70 can add together signals read from the infrared-dedicated pixel PXL22B including the photodiode PD22 serving as the infrared (NIR) photoelectric conversion part to signals read from the G pixel PXL11 including the photodiode PD11 serving as the green photoelectric conversion part, the B pixel PXL12 including the photodiode PD12 serving as the blue photoelectric conversion part, and the R pixel PXL21 including the photodiode PD21 serving as the red photoelectric conversion part. In the second mode MOD2 including the infrared reading mode MIRRD, as shown in FIG. 11, the reading part 70 can add together signals read from the G pixel PXL11 including the photodiode PD11 serving as the green photoelectric conversion part, the B pixel PXL12 including the photodiode PD12 serving as the blue photoelectric conversion part, the R pixel PXL21 including the photodiode PD21 serving as the red photoelectric conversion part, and the infrared-dedicated pixel PXL22B including the photodiode PD22 serving as the infrared (NIR) photoelectric conversion part.

In the third embodiment, the infrared reading mode MIRRD includes a first pixel signal reading mode MIRRD1, a second pixel signal reading mode MIRRD2, a third pixel signal reading mode MIRRD3, and a fourth pixel signal reading mode MIRRD4. In the first pixel signal reading mode MIRRD1, infrared pixel signals are read from the infrared-dedicated pixel PXL22B. In the second pixel signal reading mode MIRRD2, infrared pixel signals are read from the infrared-dedicated pixel PXL22B and the color pixels, the G pixel PXL11, the B pixel PXL12, and the R pixel PXL21. In the third pixel signal reading mode MIRRD3, infrared pixel signals are read from the color pixels, the G pixel PXL11, the B pixel PXL12, and the R pixel PXL21. In the fourth pixel signal reading mode MIRRD4, infrared pixel signals read from the infrared-dedicated pixel PXL22B and the color pixels, the G pixel PXL11, the B pixel PXL12, and the R pixel PXL21, are added together.

In the third embodiment, the reading part 70 can switch a mode between at least two of the first pixel signal reading mode MIRRD1, the second pixel signal reading mode MIRRD2, the third pixel signal reading mode MIRRD3, and the fourth pixel signal reading mode MIRRD4, and read pixel signals in accordance with the switched mode.

Figure 12:
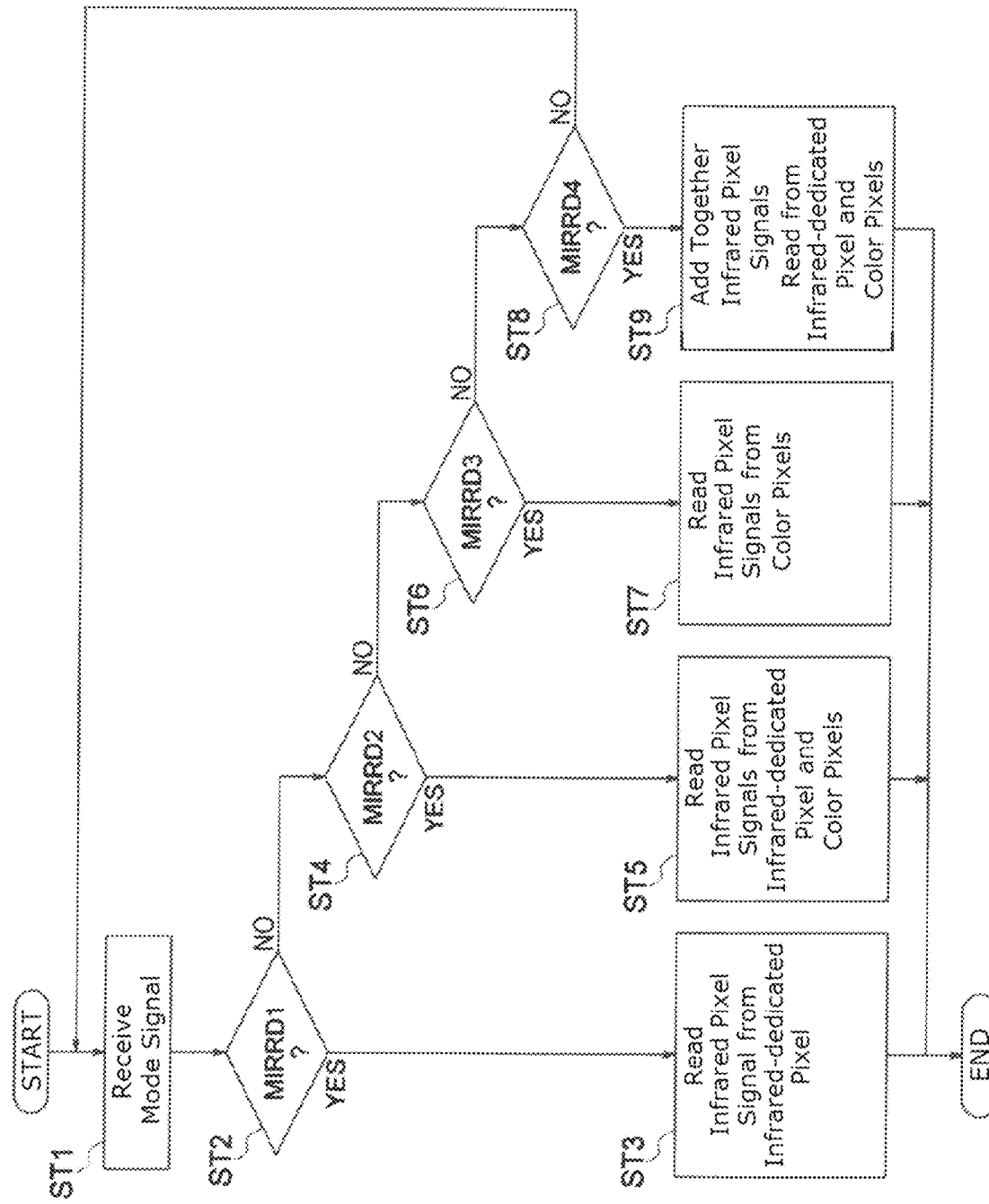
FIG. 12 is a flow chart illustrating control of a switching operation between a first to fourth pixel signal reading modes in an infrared reading mode performed by a reading part according to the third embodiment of the present invention.

FIG. 12 is a flow chart illustrating control of a switching operation between a first to fourth pixel signal reading modes in the infrared reading mode performed by the reading part according to the third embodiment of the present invention.

The reading part 70 receives a mode signal MOD from a control system (not shown) (ST1), and determines whether or not the received mode signal indicates the first pixel signal reading mode MIRRD1 of the infrared reading mode MIRRD included in the second mode MOD2 (ST2). When the reading part 70 determines, in the step ST2, that the received mode signal indicates the first pixel signal reading mode MIRRD1 of the infrared reading mode MIRRD, the reading part 70 reads an infrared pixel signal from the infrared-dedicated pixel PXL22B (ST3).

When the reading part 70 determines, in the step ST2, that the received mode signal does not indicate the first pixel signal reading mode MIRRD1 of the infrared reading mode MIRRD, the reading part 70 determines whether or not the received mode signal indicates the second pixel signal reading mode MIRRD2 (ST4). When the reading part 70 determines, in the step ST4, that the received mode signal indicates the second pixel signal reading mode MIRRD2 of the infrared reading mode MIRRD, the reading part 70 reads infrared pixel signals from the infrared-dedicated pixel PXL22B and the color pixels, the G pixel PXL11, the B pixel PXL12, and the R pixel PXL21 (ST5).

When the reading part 70 determines, in the step ST4, that the received mode signal does not indicate the second pixel signal reading mode MIRRD2 of the infrared reading mode MIRRD, the reading part 70 determines whether or not the received mode signal indicates the third pixel signal reading mode MIRRD3 (ST6). When the reading part 70 determines, in the step ST6, that the received mode signal indicates the third pixel signal reading mode MIRRD3 of the infrared reading mode MIRRD, the reading part 70 reads infrared pixel signals from the color pixels, the G pixel PXL11, the B pixel PXL12, and the R pixel PXL21 (ST7).

When the reading part 70 determines, in the step ST6, that the received mode signal does not indicate the third pixel signal reading mode MIRRD3 of the infrared reading mode MIRRD, the reading part 70 determines whether or not the received mode signal indicates the fourth pixel signal reading mode MIRRD4 (ST8). When the reading part 70 determines, in the step ST8, that the received mode signal indicates the fourth pixel signal reading mode MIRRD4 of the infrared reading mode MIRRD, the reading part 70 adds together infrared pixel signals read from the infrared-dedicated pixel PXL22B and the color pixels, the G pixel PXL11, the B pixel PXL12, and the R pixel PXL21 (ST9).

When the reading part 70 determines, in the step ST8, that the received mode signal does not indicate the fourth pixel signal reading mode MIRRD4 of the infrared reading mode MIRRD, the reading part 70 may return to the step ST1 and repeat the series of operations described above.

The third embodiment makes it possible not only to obtain the same effect as the first embodiment, but also to further improve the NIR sensitivity.

Fourth Embodiment

Figure 13:
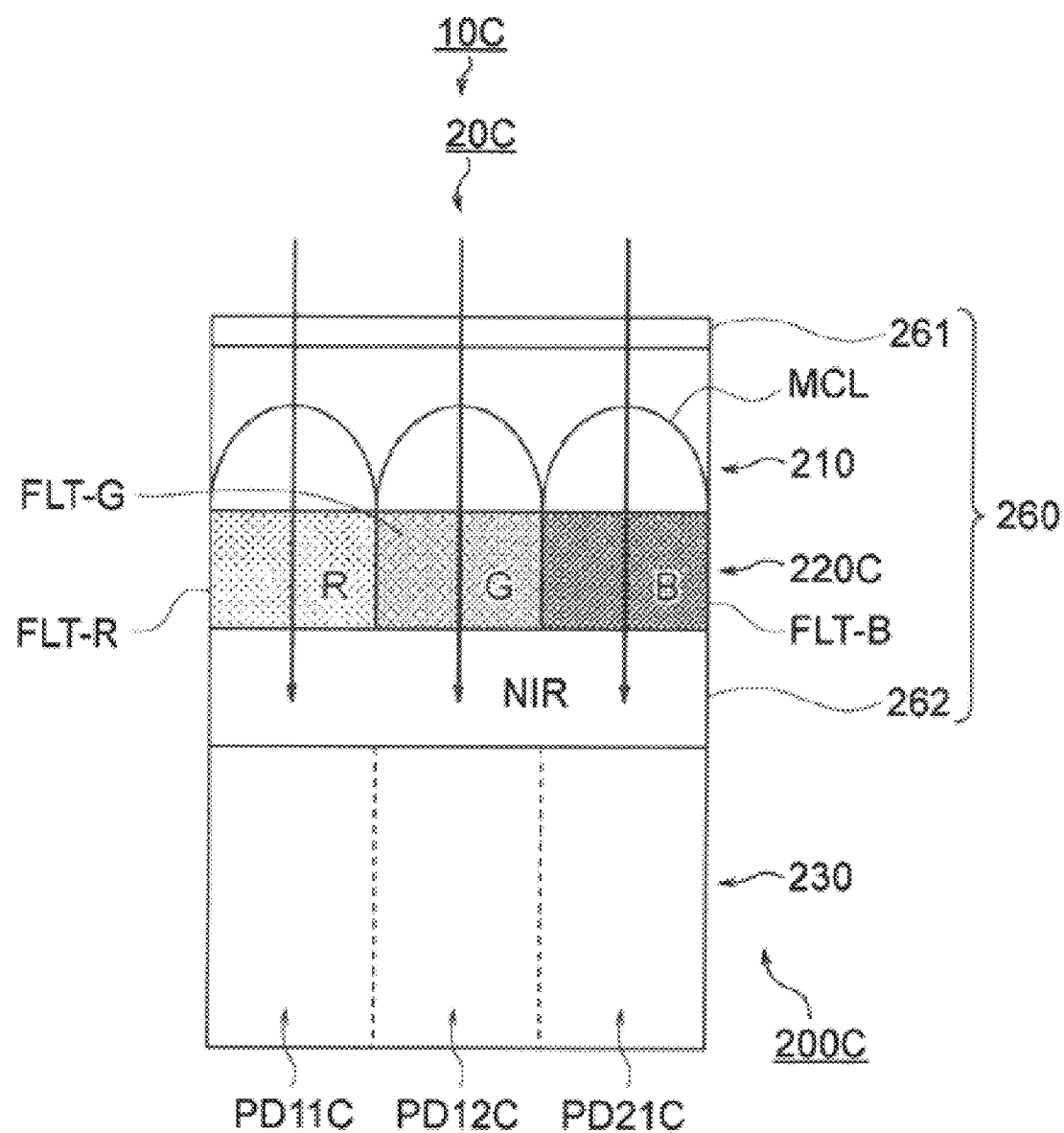
FIG. 13 is a simplified sectional view showing a schematic configuration of a solid-state imaging device (a CMOS image sensor) according to a fourth embodiment of the present invention.
Figure 14:
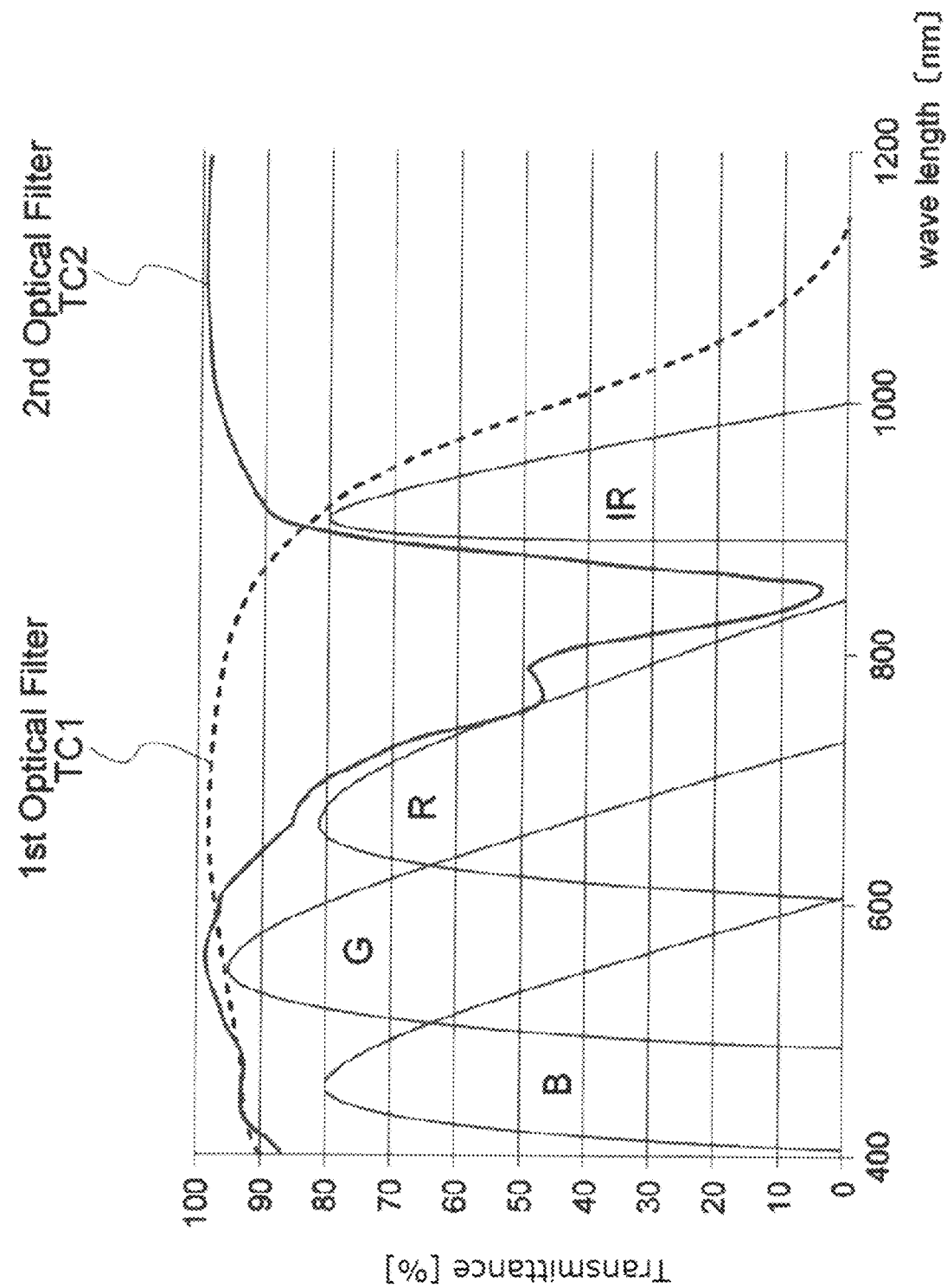
FIG. 14 shows transmission characteristics of a color filter array and optical filters according to the fourth embodiment of the present invention.

FIG. 13 is a simplified sectional view showing a schematic configuration of the solid-state imaging device (the CMOS image sensor) according to the fourth embodiment of the present invention. FIG. 14 shows transmission characteristics of a color filter array and optical filters according to the fourth embodiment of the present invention.

The fourth embodiment differs from the third embodiment in the following points. In the fourth embodiment, a photodiode PD11C serving as the red (R) photoelectric conversion part, a photodiode PD12C serving as the green (G) photoelectric conversion part, and a photodiode PD21C serving as the blue (B) photoelectric conversion part are arranged in this order and operate also as photodiodes serving as infrared (NIR) photoelectric conversion parts. The photodiode PD22 serving as the infrared (NIR) photoelectric conversion part is not provided.

In the fourth embodiment, the unit pixel groups 200C each include an optical filter group 260 including a plurality of optical filters capable of receiving visible light and infrared light having a particular wavelength. The optical filter group 260 includes a first optical filter 261 and a second optical filter 262. The first optical filter 261 is disposed on the light incidence side of the red filter FLT-R, the green filter FLT-G, and the blue filter FLT-B. The second optical filter 262 is disposed between the red filter FLT-R, the green filter FLT-G, and the blue filter FLT-B of the color filter array 220C and one surface side of the photodiode PD11C serving as the red (R) photoelectric conversion part, a photodiode PD12C serving as the green (G) photoelectric conversion part, and a photodiode PD21C serving as the blue (B) photoelectric conversion part, and the second optical filter 262 is formed of a selective IR-cut material.

The positions of the color filter array 220C and the second optical filter 262 are not limited to those shown in FIG. 13. It is also possible that the second optical filter 262 is disposed on the microlens array 210 side and the color filter array 220C is disposed on the one surface side of the photodiodes PD11C, PD12C, PD21C.

The solid-state imaging device 10C of the fourth embodiment includes the first optical filter 261 such as an IR filter on an optical system, and also includes the second optical filter 262 constituted by an on-chip selective IR filter.

In the fourth embodiment, the plurality of optical filters are formed of, for example, band-pass filters. In the example shown in FIG. 14, the pass (transmission) wavelength band of the first optical filter 261 ranges, for example, from 380 nm to 1,100 nm, which is wider than the visible region ranging approximately from 380 nm to 780 nm. The pass (transmission) wavelength band of the second optical filter 262 ranges, for example, over the visible region approximately from 380 nm to 780 nm and the region of 900 nm or longer. The second optical filter 262 blocks the wavelength band ranging from 780 nm to 900 nm. Therefore, the second optical filter 262 can be regarded as a selective infrared (IR) cut filter.

In the fourth embodiment, at least one of the plurality of optical filters (the two optical filters 261, 262 in the fourth embodiment) is capable of switching the receivable light wavelength. Further, the second optical filter 262 is disposed on the one surface side (the light incidence side) of the photodiode PD11C serving as the red (R) photoelectric conversion part, a photodiode PD12C serving as the green (G) photoelectric conversion part, and a photodiode PD21C serving as the blue (B) photoelectric conversion part. The plurality of optical filters (the two optical filters 261, 262 in the fourth embodiment) are disposed on an optical system, a package, and the pixels.

In FIG. 14, the curve represented by the broken line TC1 indicates the transmission characteristics of the first optical filter 261, and the curve represented by the thick solid line TC2 indicates the transmission characteristics of the second optical filter 262. In the fourth embodiment, the pass wavelength bands of the first optical filter 261 and the second optical filter 262 are partially different (the cutoff wavelengths are different), as shown in FIG. 14.

As shown in FIG. 14, the solid-state imaging device 10C including the optical filter group 260 is capable of transmission of visible light having RGB or other colors and infrared light having a particular wavelength and receiving the transmitted light at the photoelectric conversion parts. In the fourth embodiment, the particular infrared wavelength ranges from 800 nm to 1,000 nm, and more preferably, from 850 nm to 950 nm.

For example, an image sensor that receives the normal visible light and infrared light having a wavelength ranging from 800 nm to 1,000 nm for biometric authentication can capture visible light images having fine RGB colors and NIR images with reduced color mixing, if the optical filter groups 260 can cut unnecessary light having a wavelength of 650 nm to 800 nm and infrared light having a wavelength of 1,000 nm or longer.

The fourth embodiment makes it possible not only to obtain the same effect as the first embodiment, but also to capture RGB images and NIR images having reduced cross talk.

Fifth Embodiment

Figure 15:
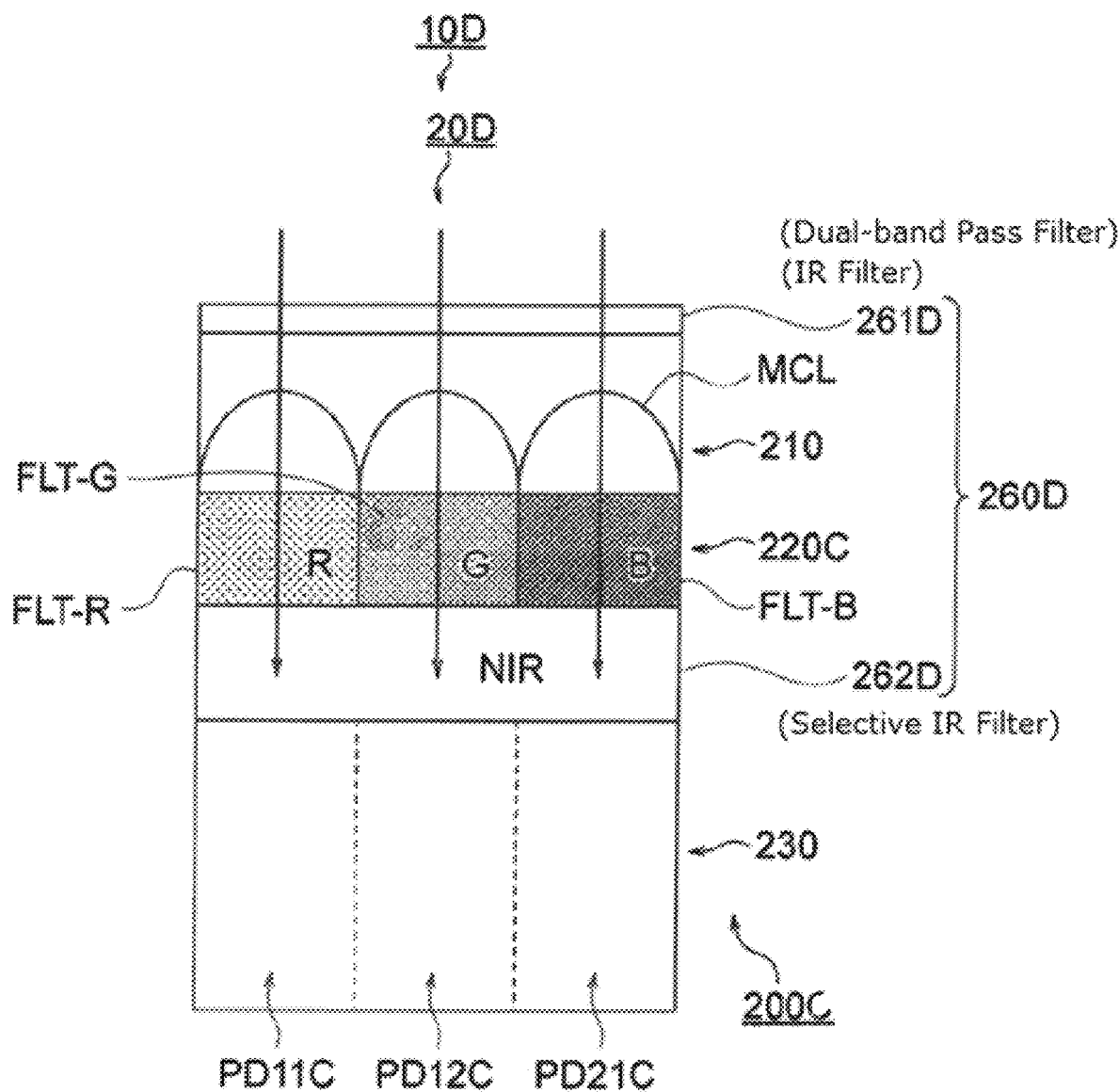
FIG. 15 is a simplified sectional view showing a schematic configuration of a solid-state imaging device (a CMOS image sensor) according to a fifth embodiment of the present invention.
Figure 16:
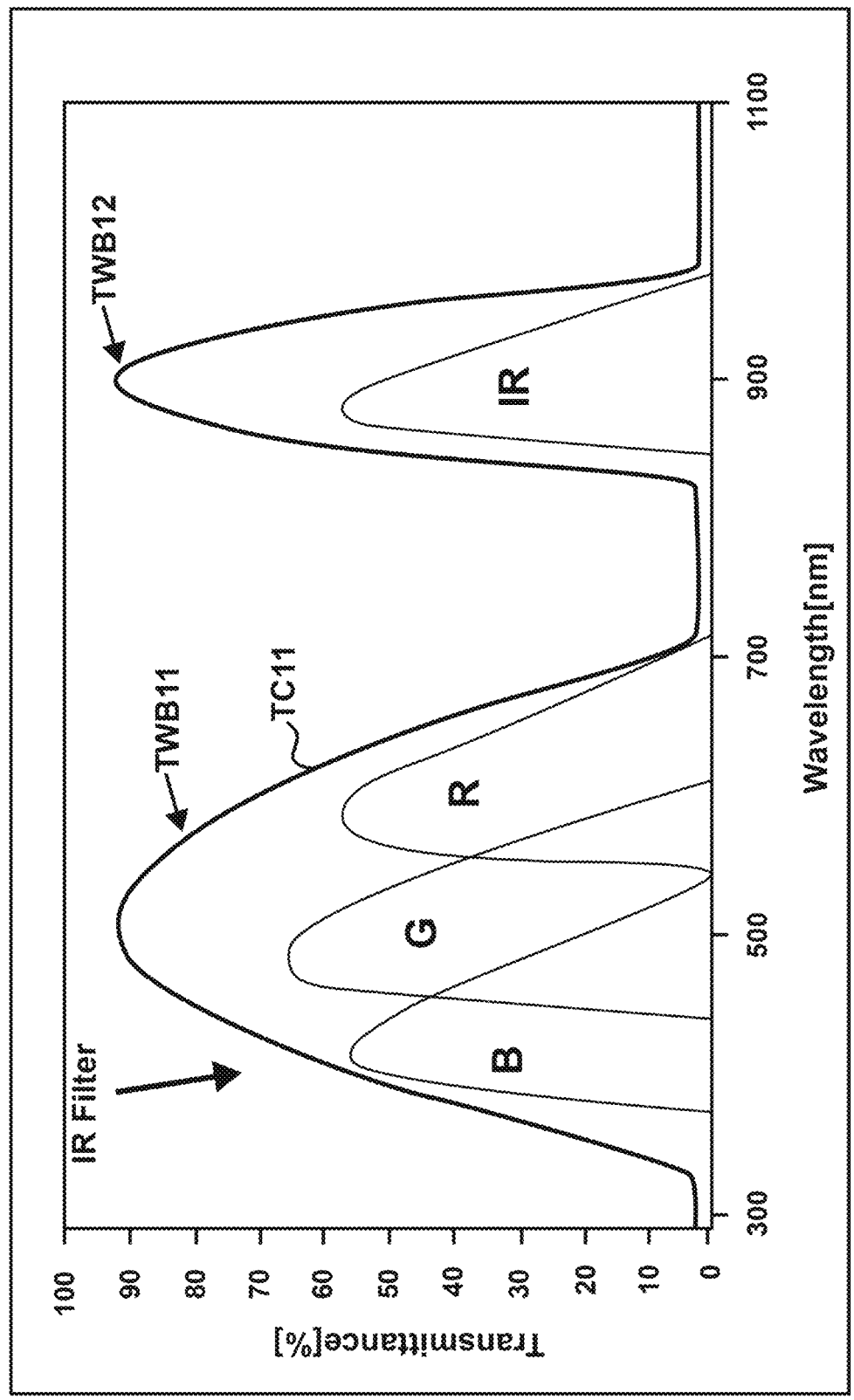
FIG. 16 shows transmission characteristics of a color filter array and optical filters according to the fifth embodiment of the present invention.

FIG. 15 is a simplified sectional view showing a schematic configuration of the solid-state imaging device (the CMOS image sensor) according to the fifth embodiment of the present invention. FIG. 16 shows transmission characteristics of the color filter array and the optical filters according to the fifth embodiment of the present invention. In FIG. 16, the curve represented by the thick solid line TC11 indicates the transmission characteristics of the first optical filter 261D.

The fifth embodiment differs from the fourth embodiment in the following points. In the fourth embodiment described above, the pass (transmission) wavelength band of the first optical filter 261 is constituted by, for example, one wavelength band ranging from 380 nm to 1,100 nm, which is wider than the visible region ranging approximately from 380 nm to 780 nm.

By contrast, in the fifth embodiment, the pass (transmission) wavelength band of the first optical filter 261D is constituted by a plurality of light wavelength bands (two light wavelength bands in the fifth embodiment). More specifically, the first optical filter 261D has two regions of the pass (transmission) wavelength band. One is a first pass (transmission) region TWB11 ranging over the visible light wavelength band (the visible region) approximately from 380 nm to 700 nm, and the other is a second pass (transmission) region TWB12 ranging over the infrared light wavelength band (the infrared region) approximately from 850 nm to 1,000 nm. That is, the first optical filter 261D operates as an on-lid dual band pass filter and also operates as an infrared (IR) filter.

Figure 17:
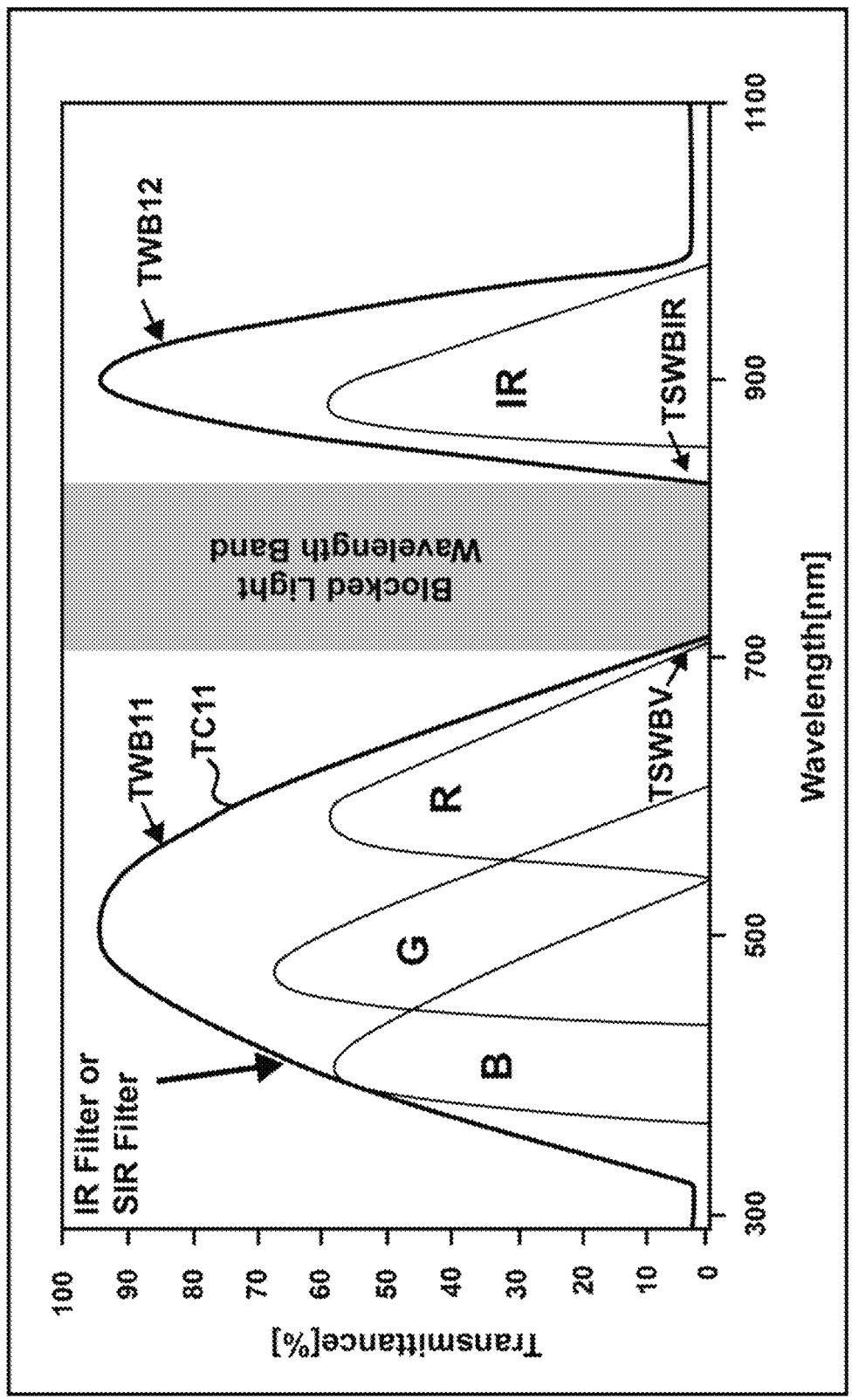
FIG. 17 illustrates a method of determining cut-off wavelengths at blocked wavelength band edges so as to optically block light of wavelengths between the visible light wavelength band and the infrared light wavelength band.

FIG. 17 illustrates a method of determining cut-off wavelengths at blocked light wavelength band edges so as to optically block light of wavelengths between the visible light wavelength band and the infrared light wavelength band.

In optically blocking light of wavelengths between a plurality of light wavelength bands, or more specifically, between the visible light wavelength band and the infrared light wavelength band, as shown in FIG. 17, the cut-off wavelengths of the blocked light wavelength band edges TSWBV, TSWBIR are determined by an infrared filter constituting a first optical filter 261D or an on-chip selective infrared filter constituting a second optical filter 262D.

The fifth embodiment makes it possible to select a desired light wavelength band for imaging with a minimum number of optical filters (IR filters). For example, in imaging in a visible light band and an infrared light band, an IR filter having such a transmittance as shown in FIG. 16 can be used alone for the imaging.

Alternatively, a selective IR filter can be used to determine the cut-off wavelength so as to reduce angle dependence and cross talk.

Sixth Embodiment

Figure 18:
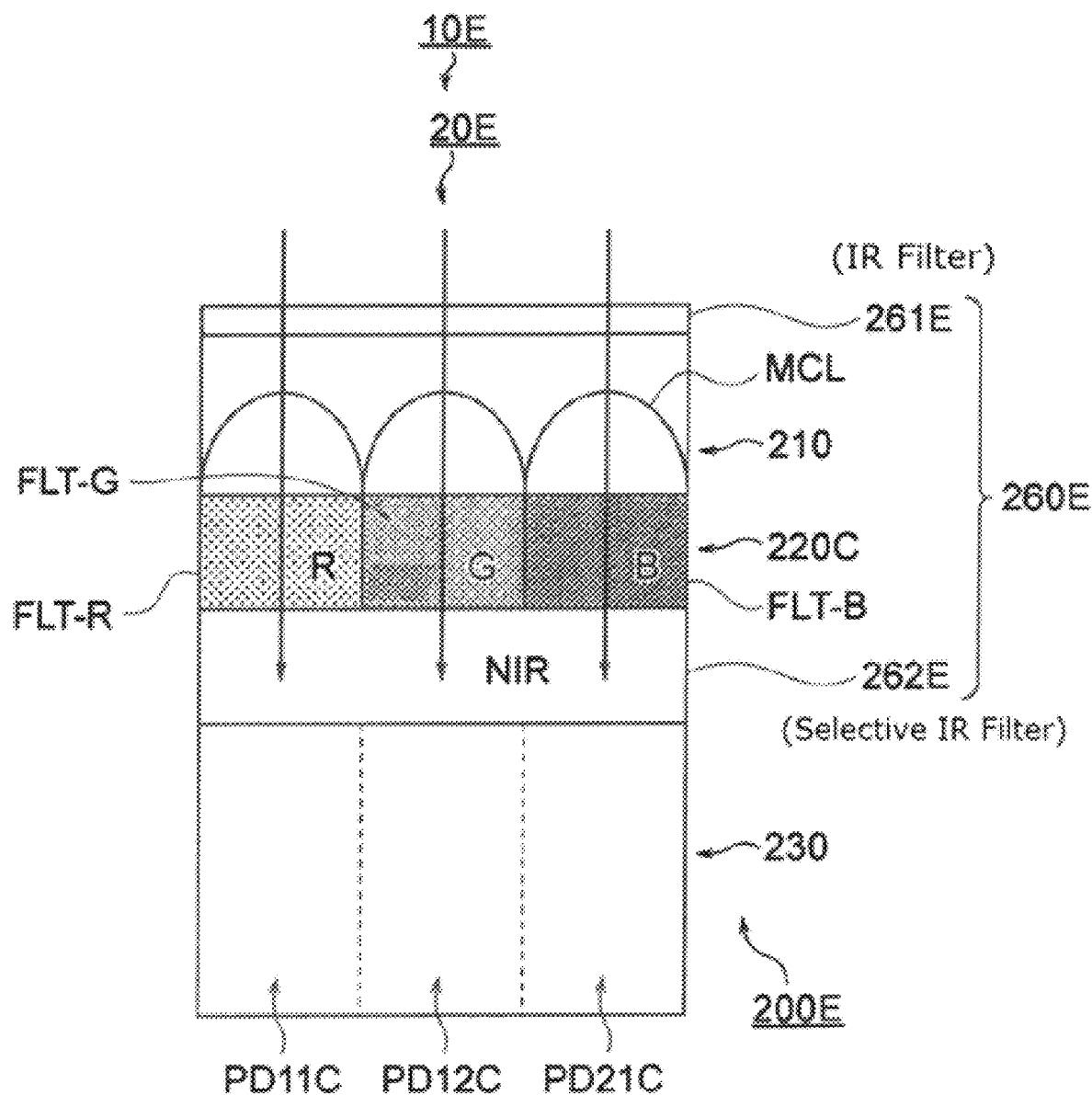
FIG. 18 shows transmission characteristics of a color filter array and optical filters according to a sixth embodiment of the present invention.
Figure 19:
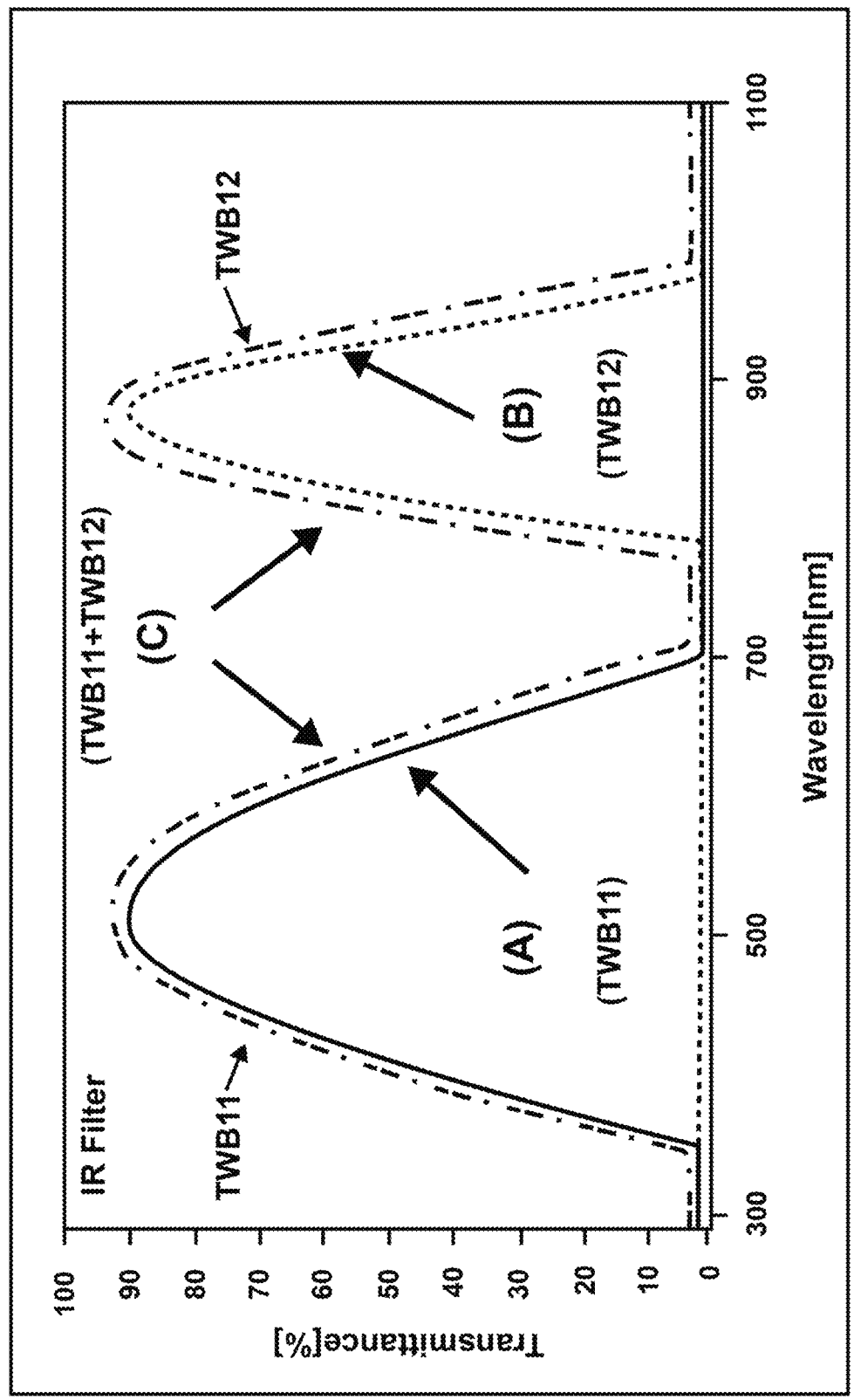
FIG. 19 shows transmission characteristics of a color filter array and optical filters according to the sixth embodiment of the present invention.

FIG. 18 is a simplified sectional view showing a schematic configuration of the solid-state imaging device (the CMOS image sensor) according to the sixth embodiment of the present invention. FIG. 19 shows transmission characteristics of the color filter array and the optical filters according to the sixth embodiment of the present invention.

The sixth embodiment differs from the fifth embodiment in the following points. In the fifth embodiment described above, the pass (transmission) wavelength band of the first optical filter 261D is constituted by a plurality of light wavelength bands (two light wavelength bands in the fifth embodiment). More specifically, the first optical filter 261E has two regions of the pass (transmission) wavelength band. One is a first pass (transmission) region TWB11 ranging over the visible light wavelength band (the visible region) approximately from 380 nm to 700 nm, and the other is a second pass (transmission) region TWB12 ranging over the infrared light wavelength band (the infrared region) approximately from 850 nm to 1,000 nm.

The sixth embodiment is further configured so as to be capable of selecting a pass region (a pass band). As shown in FIG. 19, when the band A is selected, the optical filter 261E operates as an IR filter capable of imaging only in the first pass (transmission) region TWB11 ranging over the visible light wavelength band (the visible region) approximately from 380 nm to 700 nm. When the band B is selected, the optical filter 261E operates as an IR filter capable of imaging only in the second pass (transmission) region TWB12 ranging over the infrared light wavelength band (the infrared region) approximately from 850 nm to 1,000 nm. When the band C is selected, the optical filter 261E operates as an IR filter capable of imaging in both the first pass (transmission) region TWB11 ranging over the visible light wavelength band (the visible region) approximately from 380 nm to 700 nm and the second pass (transmission) region TWB12 ranging over the infrared light wavelength band (the infrared region) approximately from 850 nm to 1,000 nm.

The sixth embodiment makes it possible to select a desired light wavelength band for imaging with a minimum number of optical filters (IR filters).

Seventh Embodiment

Figure 20:
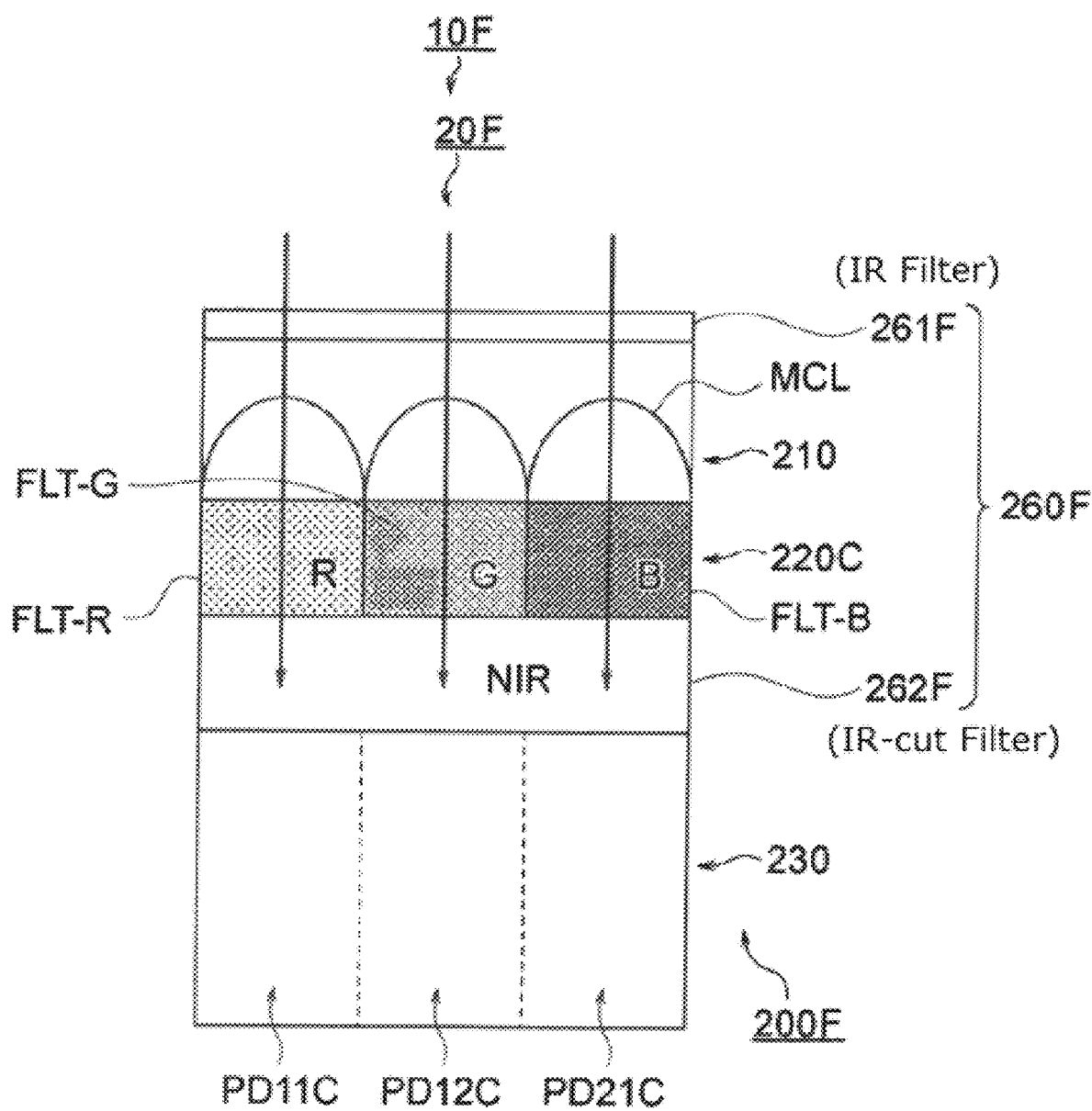
FIG. 20 is a simplified sectional view showing a schematic configuration of a solid-state imaging device (a CMOS image sensor) according to a seventh embodiment of the present invention.
Figure 21:
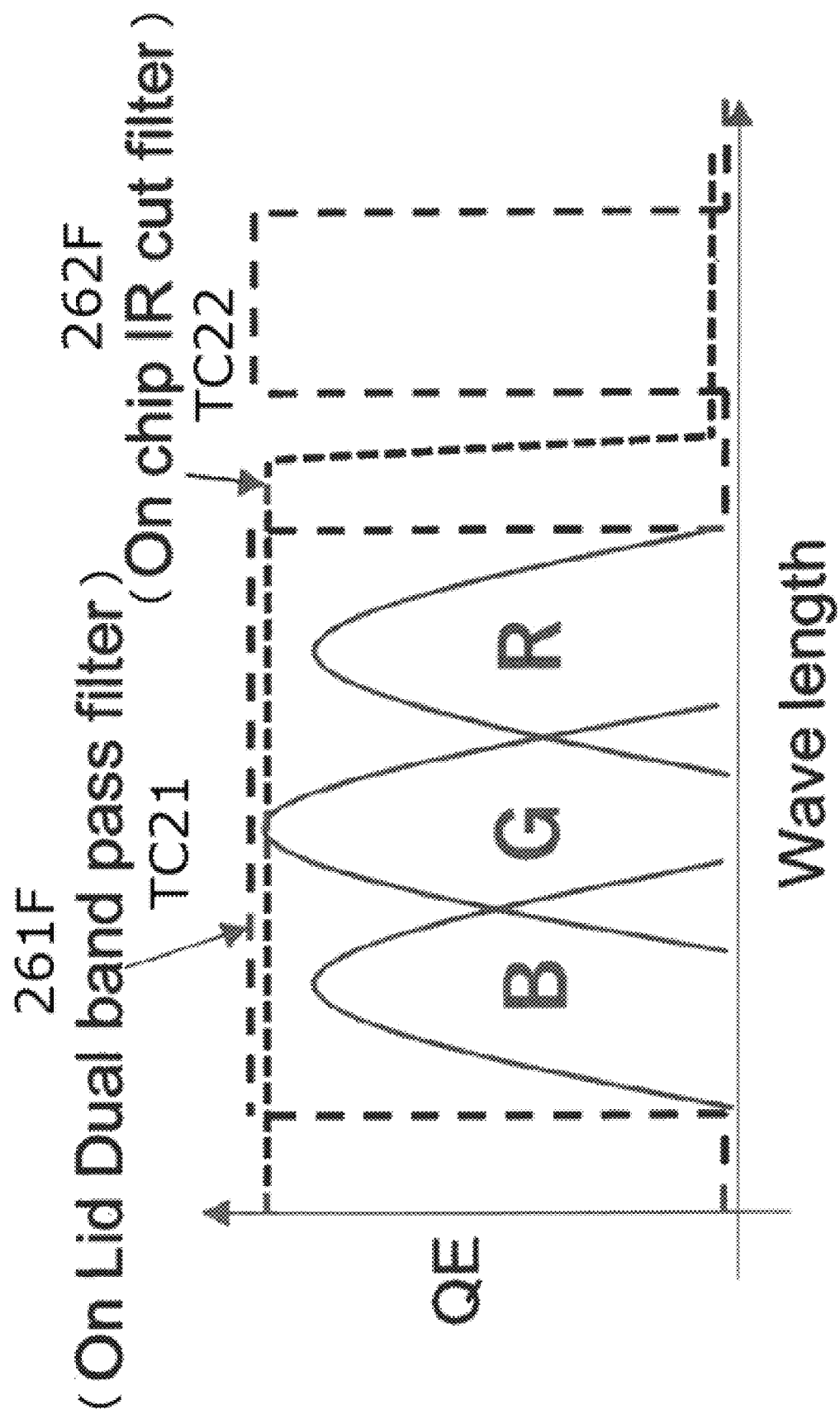
FIG. 21 shows transmission characteristics of a color filter array and optical filters according to the seventh embodiment of the present invention.

FIG. 20 is a simplified sectional view showing a schematic configuration of the solid-state imaging device (the CMOS image sensor) according to the seventh embodiment of the present invention. FIG. 21 shows transmission characteristics of the color filter array and the optical filters according to the seventh embodiment of the present invention.

In FIG. 21, the abscissa is wavelength, and the ordinate is quantization efficiency (QE). In FIG. 21, the line TC21 indicates the transmission characteristics of the first optical filter 261F that operates as an on-lid dual band pass filter and also operates as an infrared (IR) filter, and the line TC22 indicates the transmission characteristics of the second optical filter 262F that operates as an on-chip IR cut filter.

The seventh embodiment differs from the sixth embodiment in the following points. In the seventh embodiment, the second optical filter 262F constituted by a selective infrared filter is constituted by a selective infrared (IR) cut filter that blocks the infrared light wavelength band.

The seventh embodiment makes it possible to combine the IR filter on the optical system and the on-chip IR cut filter into the R, G, and B pixels and select a desired light wavelength band for imaging with a minimum number of optical filters (IR filters).

Eighth Embodiment

Figure 22:
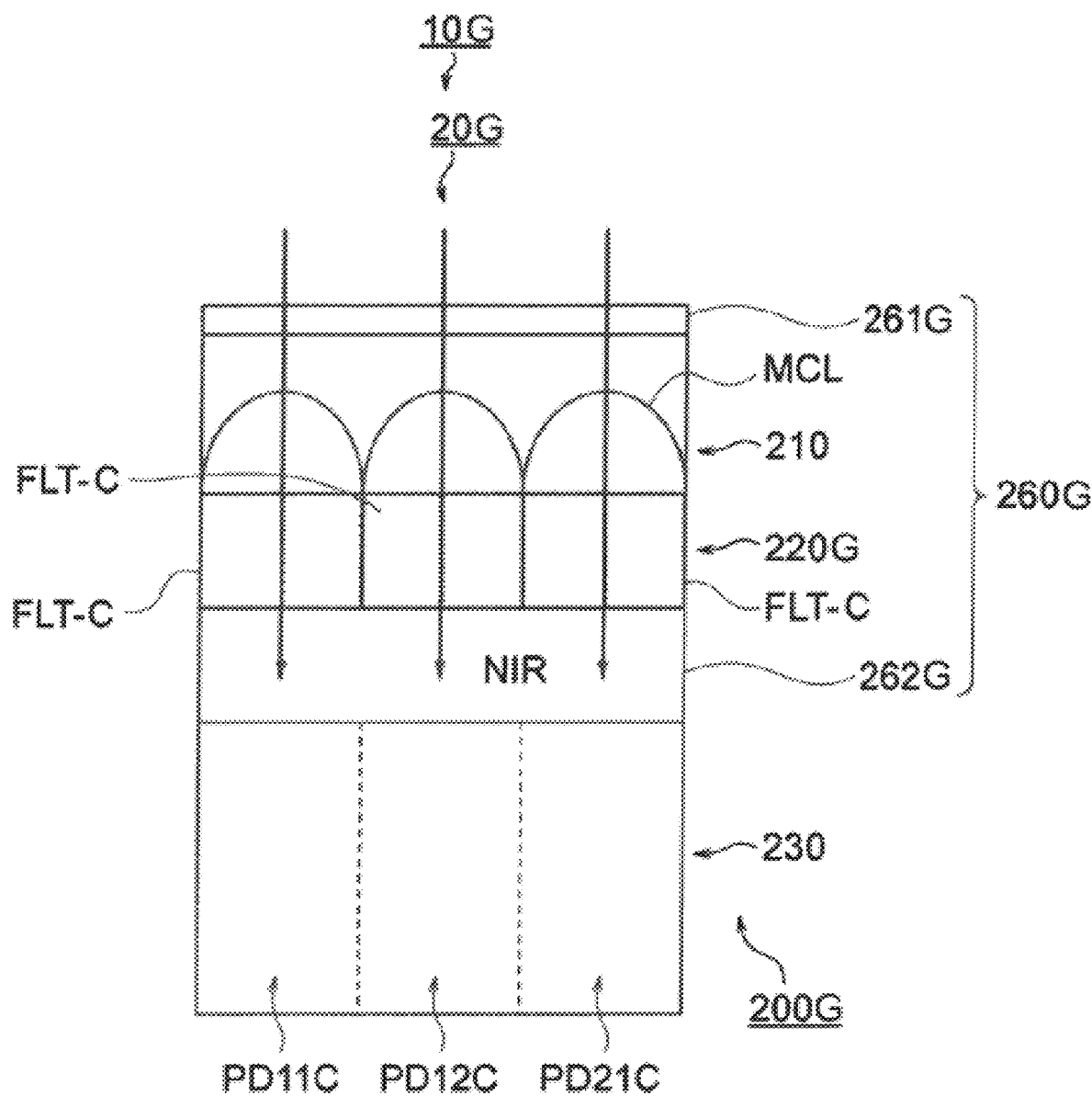
FIG. 22 is a simplified sectional view showing a schematic configuration of a solid-state imaging device (a CMOS image sensor) according to an eighth embodiment of the present invention.
Figure 23:
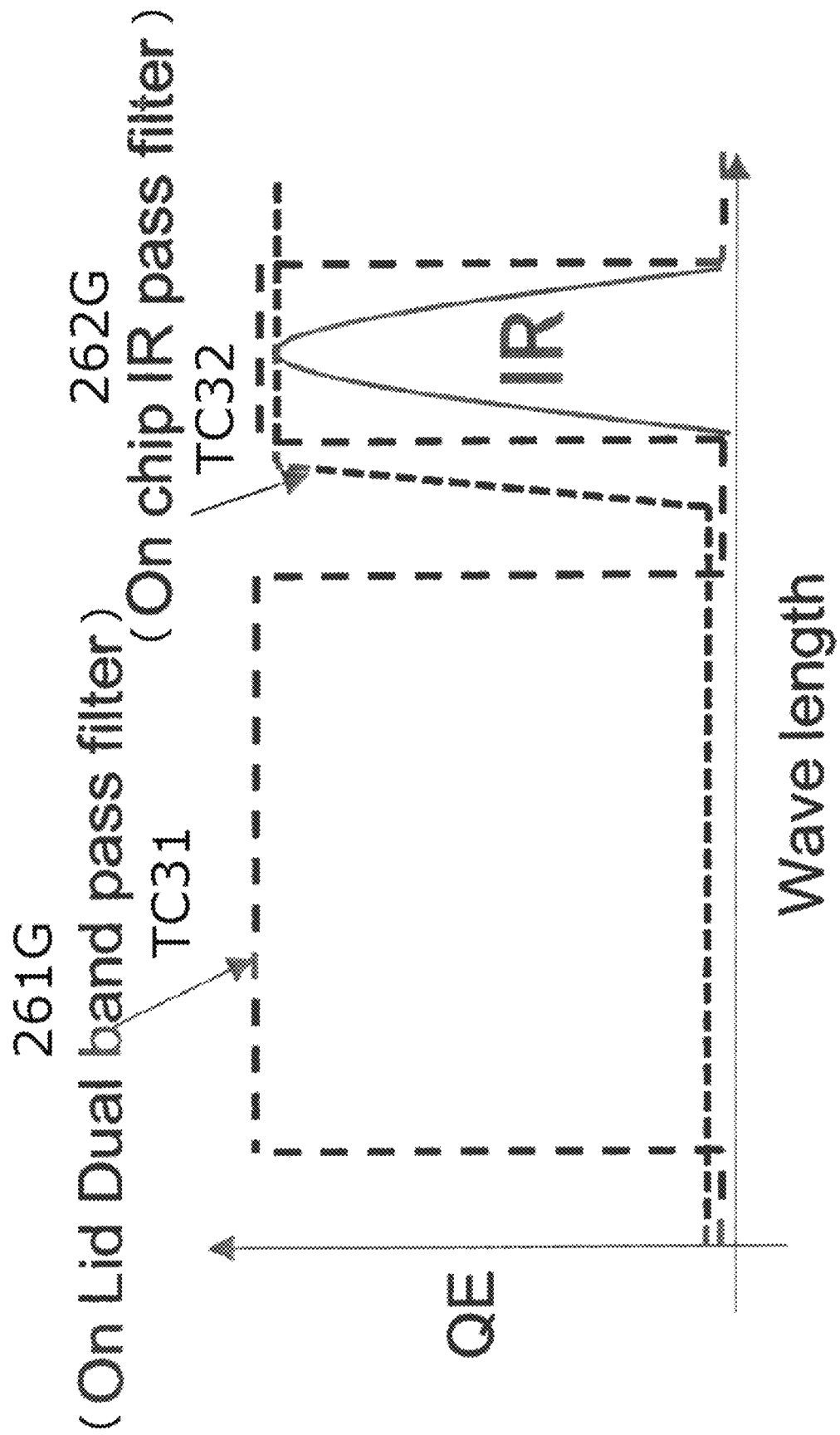
FIG. 23 shows transmission characteristics of a color filter array and optical filters according to the eighth embodiment of the present invention.

FIG. 22 is a simplified sectional view showing a schematic configuration of the solid-state imaging device (the CMOS image sensor) according to the eighth embodiment of the present invention. FIG. 23 shows transmission characteristics of the color filter array and the optical filters according to the eighth embodiment of the present invention.

In FIG. 23, the abscissa is wavelength, and the ordinate is quantization efficiency (QE). In FIG. 23, the line TC31 indicates the transmission characteristics of the first optical filter 261G that operates as an on-lid dual band pass filter and also operates as an infrared (IR) filter, and the line TC32 indicates the transmission characteristics of the second optical filter 262G that operates as an on-chip IR pass filter.

The eighth embodiment differs from the sixth embodiment in the following points. In the eighth embodiment, the second optical filter 262G constituted by a selective infrared filter is constituted by a selective infrared (IR) pass filter that transmits the infrared light wavelength band. In addition, in the eighth embodiment, each of the filters of the filter array 220G is constituted by a clear filter FLT-C that transmits the entirety of the visible light wavelength band.

The eighth embodiment makes it possible to combine the IR filter on the optical system and the on-chip IR pass filter into the NIR pixel and select a desired light wavelength band for imaging with a minimum number of optical filters (IR filters).

Ninth Embodiment

Figure 24:
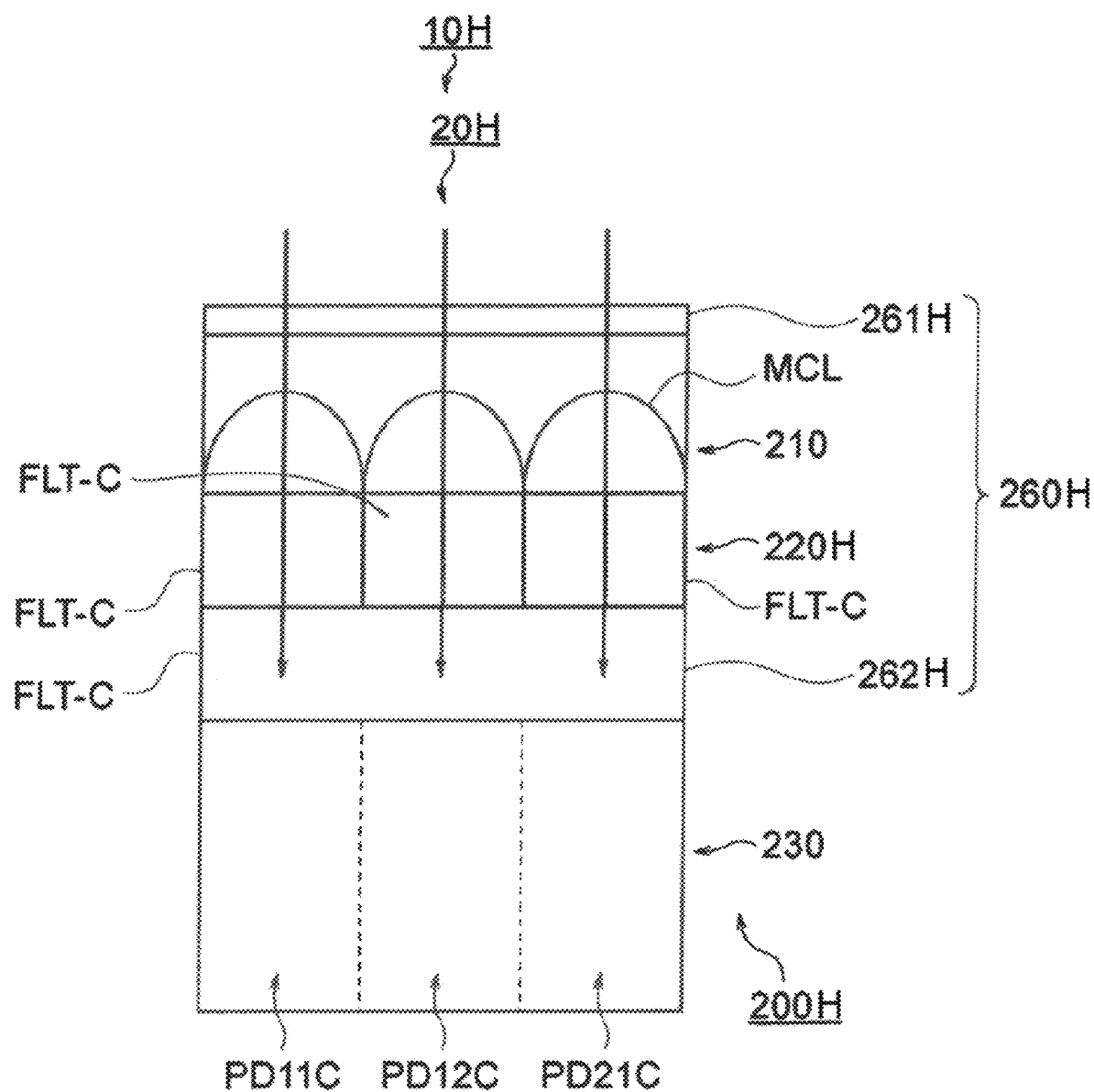
FIG. 24 is a simplified sectional view showing a schematic configuration of a solid-state imaging device (a CMOS image sensor) according to a ninth embodiment of the present invention.
Figure 25:
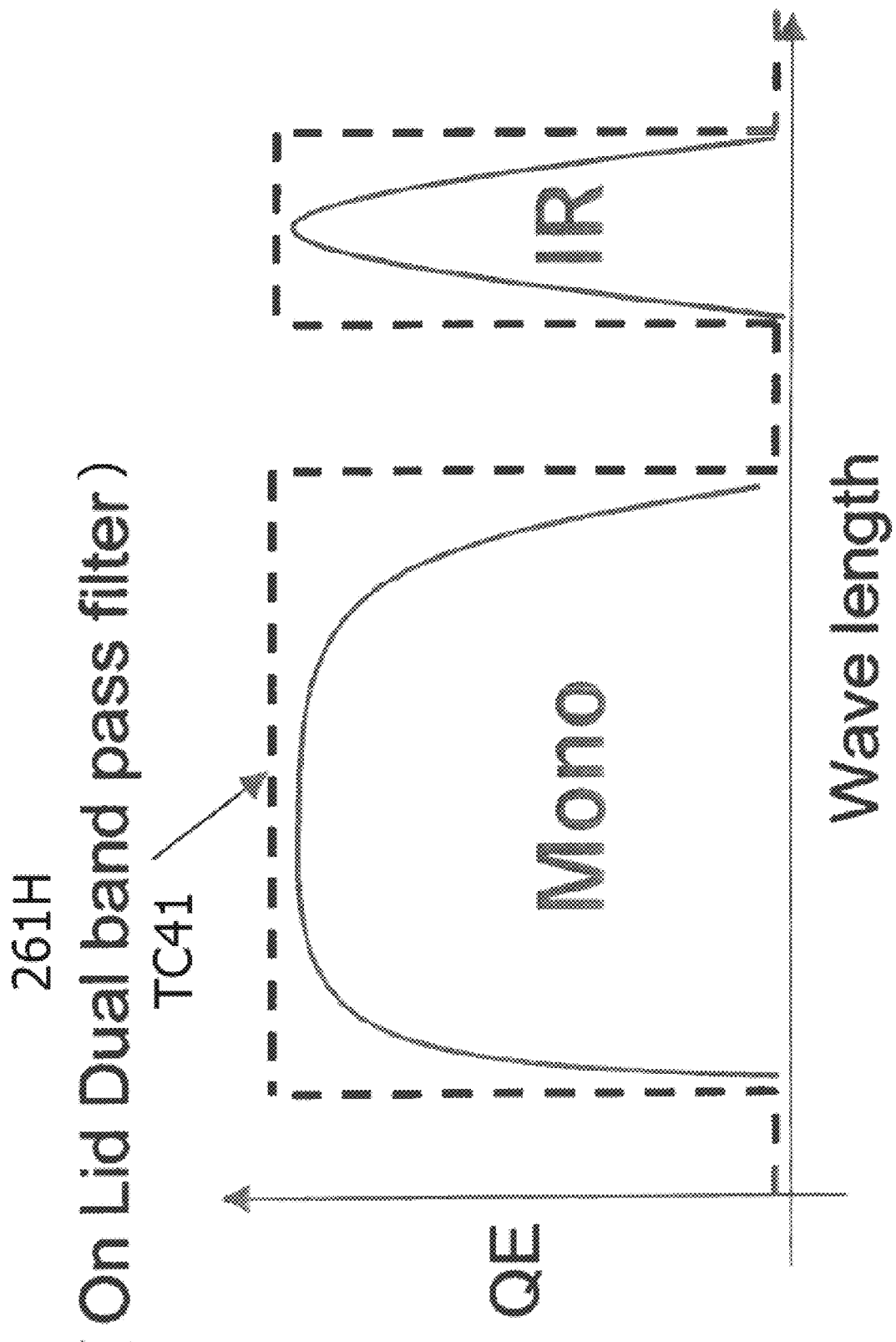
FIG. 25 shows transmission characteristics of a color filter array and optical filters according to the ninth embodiment of the present invention.

FIG. 24 is a simplified sectional view showing a schematic configuration of the solid-state imaging device (the CMOS image sensor) according to the ninth embodiment of the present invention. FIG. 25 shows transmission characteristics of the color filter array and the optical filters according to the ninth embodiment of the present invention.

In FIG. 25, the abscissa is wavelength, and the ordinate is quantization efficiency (QE). In FIG. 25, the line TC41 indicates the transmission characteristics of the first optical filter 261H that operates as an on-lid dual band pass filter and also operates as an infrared (IR) filter.

The ninth embodiment differs from the sixth embodiment in the following points. In the ninth embodiment, the second optical filter 262H constituted by a selective infrared filter and the filters of the filter array 220H are constituted by a clear filter FLT-C that transmits the entirety of the visible light wavelength band.

The ninth embodiment makes it possible to combine the IR filter on the optical system and the on-chip IR pass filter into a monochrome pixel and the NIR pixel and select a desired light wavelength band for imaging with a minimum number of optical filters (IR filters).

Tenth Embodiment

Figure 26:
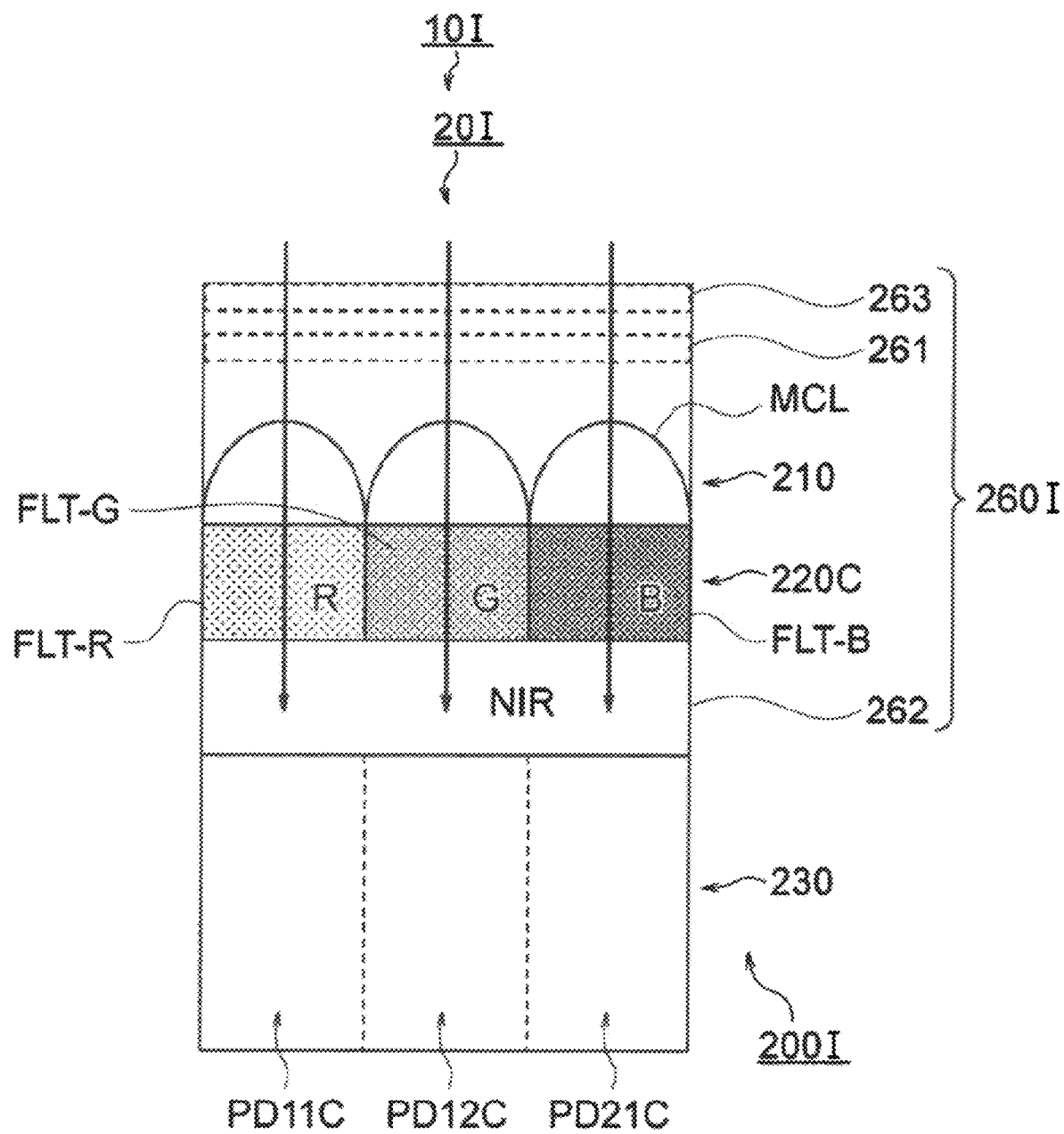
FIG. 26 is a simplified sectional view showing a schematic configuration of a solid-state imaging device (a CMOS image sensor) according to a tenth embodiment of the present invention.
Figure 27:
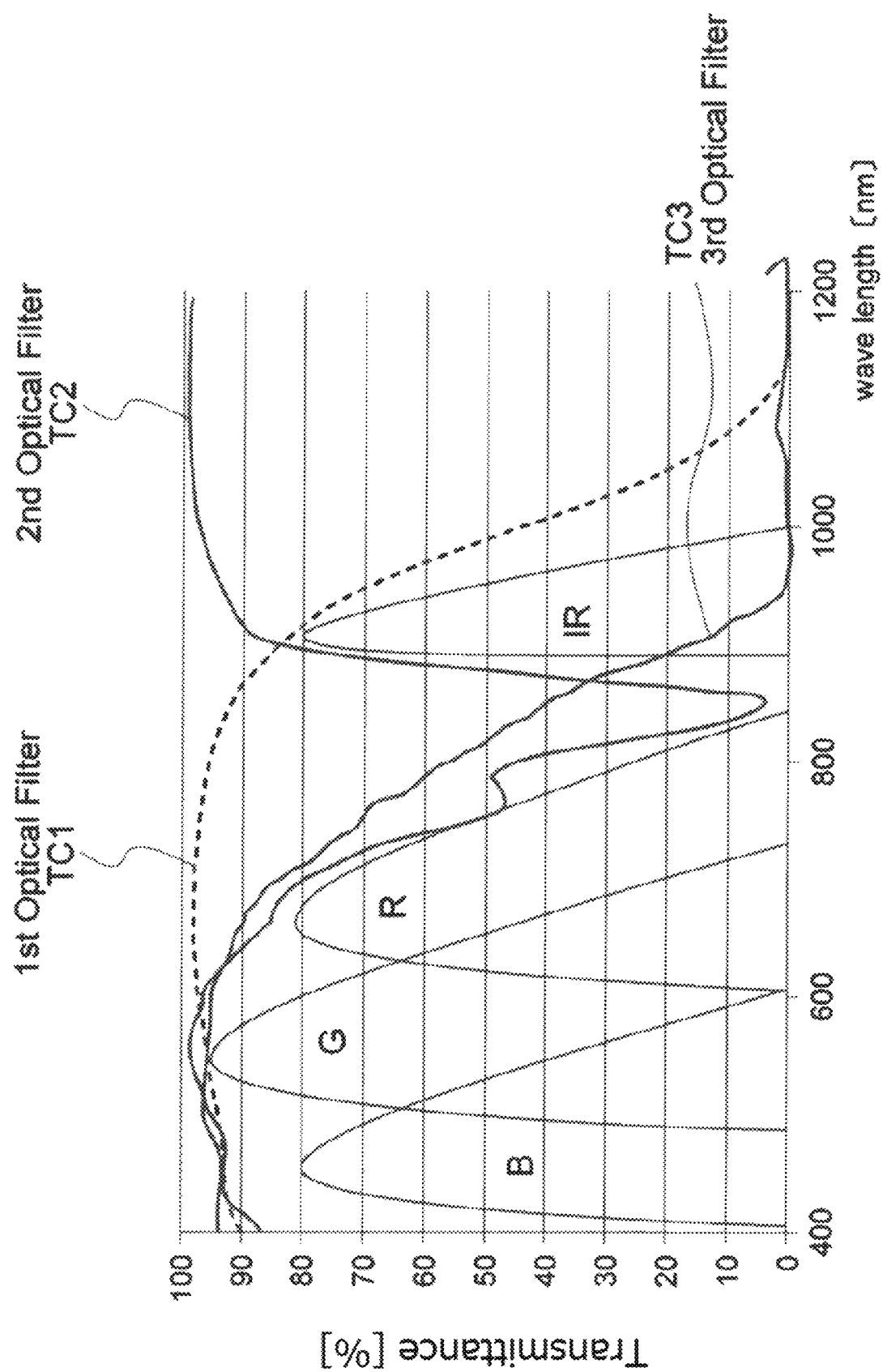
FIG. 27 shows transmission characteristics of a color filter array and optical filters according to the tenth embodiment of the present invention.

FIG. 26 is a simplified sectional view showing a schematic configuration of the solid-state imaging device (the CMOS image sensor) according to the tenth embodiment of the present invention. FIG. 27 shows transmission characteristics of the color filter array and the optical filters according to the tenth embodiment of the present invention.

The tenth embodiment differs from the fourth embodiment in the following points. In the tenth embodiment, the optical filter group 2601 may include a third optical filter 263 disposed on the light incidence side of the red filter FLT-R, the green filter FLT-G, and the blue filter FLT-B. For example, the second infrared cut filter 262I is formed on-chip in the CMOS image sensor (CIS), and the first optical filter 261 and/or the third optical filter 263 is formed on or under the glass lid or in the optical lens system of the CIS.

In FIG. 27, the curve represented by the broken line TC1 indicates the transmission characteristics of the first optical filter 261, the curve represented by the thick solid line TC2 indicates the transmission characteristics of the second optical filter 262, and the curve represented by the thick solid line TC3 indicates the transmission characteristics of the third optical filter 263. In the example shown in FIG. 27, the pass wavelength band of the third optical filter 263 ranges, for example, approximately from 380 nm to 950 nm, which is wider than the visible region ranging approximately from 380 nm to 780 nm.

In the tenth embodiment, switching is possible to a first light-receiving mode for receiving visible light only and a second light-receiving mode capable of receiving incident light including infrared light, by switching the receivable light wavelengths of the plurality of optical filters (for example, by switching combinations of the plurality of optical filters).

In the tenth embodiment, for example, in the first light-receiving mode for receiving visible light only, imaging is performed by the second optical filter 262 and the third optical filter 263. In the second light-receiving mode capable of receiving incident light including infrared light, imaging is performed by the first optical filter 261 and the second optical filter 262.

The tenth embodiment makes it possible not only to obtain the same effect as the fourth embodiment, but also to capture RGB images and NIR images having further reduced cross talk.

The solid-state imaging devices 10, 10A to 10I described above can be applied, as imaging devices, to electronic apparatuses such as digital cameras, video cameras, mobile terminals, surveillance cameras, and medical endoscope cameras.

Figure 28:
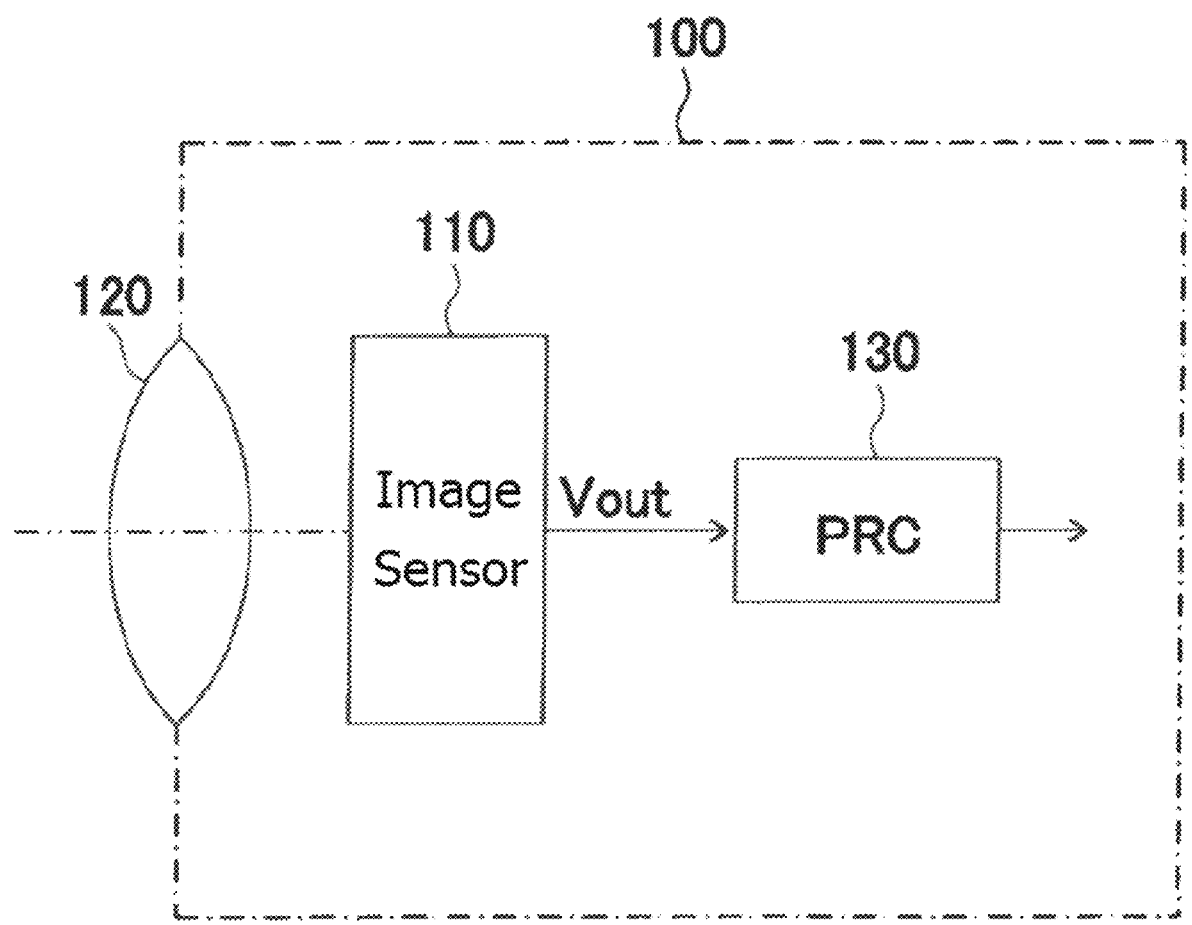
FIG. 28 shows an example of the configuration of an electronic apparatus to which the solid-state imaging device according to the embodiments of the present invention is applied.

FIG. 28 shows an example of the configuration of an electronic apparatus including a camera system to which the solid-state imaging device according to the embodiments of the present invention is applied.

As shown in FIG. 28, the electronic apparatus 100 includes a CMOS image sensor 110 that can be constituted by the solid-state imaging device 10 according to the embodiments of the present invention. Further, the electronic apparatus 100 includes an optical system (such as a lens) 120 for redirecting the incident light to pixel regions of the CMOS image sensor 110 (to form a subject image). The electronic apparatus 100 includes a signal processing circuit (PRC) 130 for processing output signals of the CMOS image sensor 110.

The signal processing circuit 130 performs predetermined signal processing on the output signals of the CMOS image sensor 110. The image signals processed in the signal processing circuit 130 can be handled in various manners. For example, the image signals can be displayed as a video image on a monitor constituted by a liquid crystal display or the like, or the image signals can be printed by a printer or recorded directly on a storage medium such as a memory card.

As described above, a high-performance, compact, and low-cost camera system can be provided that includes the solid-state imaging device 10, 10A to 10I as the CMOS image sensor 110. Further, it is possible to produce electronic apparatuses such as surveillance cameras and medical endoscope cameras that are used for applications where cameras are required to be installed under restricted conditions such as the installation size, number of connectable cables, cable length, and installation height.

What is claimed is:

1. A solid-state imaging device comprising:
a solid-state pixel circuit having unit pixel groups arranged therein, the unit pixel groups including:
a plurality of photoelectric conversion units that performs photoelectric conversion that generates pixel signals, the plurality of photoelectric conversion units configured to photoelectrically convert light incident from one surface side corresponding to a plurality of visible light wavelength bands;
a first plurality of pixel sensors for receiving visible light including a red photoelectric conversion circuit corresponding to a red region of visible light, a green photoelectric conversion circuit corresponding to a green region of visible light, and a blue photoelectric conversion circuit corresponding to a blue region of visible light;
a second plurality of pixel sensors for receiving infrared light including at least one dedicated infrared (IR) pixel circuit, and
a reading part for reading the pixel signals from the plurality of photoelectric conversion units,
wherein in an infrared reading mode, the reading part is configured to combine infrared light portions of the pixel signals within the unit pixel groups corresponding to infrared light read from the at least one dedicated IR pixel circuit thereby capturing a near-infrared image based on the combined infrared light portions.

2. The solid-state imaging device according to claim 1, wherein a wavelength of the infrared light is 800 nm or longer.

3. The solid-state imaging device according to claim 1, wherein the reading part is configured to concurrently read, from the first plurality of pixel sensors, color pixel signals for a visible region corresponding to the visible light and, from the second plurality of pixel sensors, infrared pixel signals corresponding to the infrared light for an infrared region.

4. The solid-state imaging device according to claim 3, wherein the infrared pixel signals have a wavelength of 800 nm or shorter in a near-infrared region.

5. The solid-state imaging device according to claim 1, wherein:
in a first mode, the reading part is configured to output, signals read from the red photoelectric conversion circuit, the green photoelectric conversion circuit, and the blue photoelectric conversion circuit, and
in a second mode comprising the infrared reading mode, the reading part is further configured to combine the pixel signals read from the red photoelectric conversion circuit, the green photoelectric conversion circuit, and the blue photoelectric conversion circuit.

6. The solid-state imaging device according to claim 1, wherein the infrared reading mode includes:
a first pixel signal reading mode for reading infrared pixel signals from the at least one dedicated IR pixel circuit;
a second pixel signal reading mode for reading infrared pixel signals from the at least one dedicated IR pixel circuit and the first plurality of pixel sensors for visible light;
a third pixel signal reading mode for reading infrared pixel signals from the second plurality of pixel sensors for infrared light; and
a fourth pixel signal reading mode for adding together one or more infrared pixel signals read from the at least one dedicated IR pixel circuit of the second plurality of pixel sensors and one or more visible pixel signals from the first plurality of pixel sensors for visible light.

7. The solid-state imaging device according to claim 6, wherein the reading part is configured to switch a mode between at least two of the first pixel signal reading mode, the second pixel signal reading mode, the third pixel signal reading mode, and the fourth pixel signal reading mode, and reading the pixel signals in accordance with the mode.

8. The solid-state imaging device according to claim 6, wherein:
the unit pixel groups include a plurality of photoelectric conversion parts configured to photoelectrically convert light incident from one surface side and corresponding to the plurality of visible light wavelength bands,
the plurality of photoelectric conversion parts includes a red photoelectric conversion part corresponding to a red region, a green photoelectric conversion part corresponding to a green region, a blue photoelectric conversion part corresponding to a blue region, and an infrared photoelectric conversion part corresponding to an infrared region,
in a first mode, the reading part is configured to output, signals read from the red photoelectric conversion part, the green photoelectric conversion part, and the blue photoelectric conversion part, and
in a second mode including the infrared reading mode, the reading part is further configured to combine the pixel signals read from the red photoelectric conversion part, the green photoelectric conversion part, the blue photoelectric conversion part, and the infrared photoelectric conversion part.

9. The solid-state imaging device according to claim 1, wherein the unit pixel groups include a plurality of optical filters configured to receive visible light and infrared light having a particular infrared wavelength.

10. The solid-state imaging device according to claim 9, wherein the particular infrared wavelength ranges between 800 nm to 1,000 nm.

11. The solid-state imaging device according to claim 9, wherein at least one of the plurality of optical filters is capable of switching a receivable light wavelength.

12. The solid-state imaging device according to claim 9, wherein at least one of the plurality of optical filters is disposed on a light incidence side of a photoelectric conversion part configured to perform photoelectric conversion.

13. The solid-state imaging device according to claim 9, wherein the solid-state imaging device is configured to switch between a first light-receiving mode for receiving essentially only visible light and a second light-receiving mode for receiving incident light including infrared light, by switching receivable light wavelengths of the plurality of optical filters.

14. The solid-state imaging device according to claim 9, wherein pass wavelength bands of the plurality of optical filters are partially different.

15. The solid-state imaging device according to claim 9, wherein:
the unit pixel groups include:
a filter array having a plurality of filters for visible light; and
a plurality of photoelectric conversion parts for visible light configured to photoelectrically convert light transmitted through the plurality of filters disposed on one side, the plurality of photoelectric conversion parts corresponding to the plurality of filters, and the plurality of optical filters include:
a first optical filter disposed on a light incidence side of the plurality of filters; and
a second optical filter disposed on a light incidence side of the plurality of photoelectric conversion parts.

16. The solid-state imaging device according to claim 15, wherein the first optical filter comprises an infrared filter, the second optical filter comprises an on-chip selective infrared filter, and wherein the infrared filter is configured to transmit a plurality of light wavelength bands.

17. The solid-state imaging device according to claim 16, wherein at least one of the plurality of light wavelength bands is a visible light wavelength band or an infrared light wavelength band.

18. The solid-state imaging device according to claim 16, wherein cut-off wavelengths of blocked light wavelength band edges are determined by the infrared filter of the first optical filter or the on-chip selective infrared filter of the second optical filter.

19. The solid-state imaging device according to claim 16, wherein the on-chip selective infrared filter comprises a selective infrared cut filter that blocks an infrared light wavelength band.

20. The solid-state imaging device according to claim 16, wherein:
the on-chip selective infrared filter comprises a selective infrared pass filter that transmits an infrared light wavelength band, and
one or more of filters of the filter array is constituted by a clear filter that transmits at least a visible light wavelength band.

21. The solid-state imaging device according to claim 16, wherein the on-chip selective infrared filter and one or more filters of the filter array comprises a clear filter that transmits at least a visible light wavelength band.

22. The solid-state imaging device according to claim 15, wherein:
the plurality of optical filters further includes a third optical filter disposed on a light incidence side of the plurality of filters,
in a first light-receiving mode for receiving essentially only visible light, imaging is performed by the second optical filter and the third optical filter, and
in a second light-receiving mode for receiving incident light including infrared light, imaging is performed by the first optical filter and the second optical filter.

23. The solid-state imaging device according to claim 15, wherein the plurality of photoelectric conversion parts include a red photoelectric conversion part corresponding to a red region, a green photoelectric conversion part corresponding to a green region, and a blue photoelectric conversion part corresponding to a blue region.

24. A method of driving a solid-state imaging device, the solid-state imaging device including a solid-state pixel circuit having unit pixel groups arranged therein, the unit pixel groups including a first plurality of pixels for visible light and a second plurality of pixels for infrared light that perform photoelectric conversion that generates pixel signals, the second plurality of pixels for infrared light having a light-receiving sensitivity to infrared light, the method comprising:
reading, in an infrared reading mode, the pixel signals corresponding to infrared light from the second plurality of pixels for infrared light;
adding together infrared light portions of the pixel signals corresponding to infrared light to obtain combined infrared light portions of the pixel signals;
capturing a near-infrared image based on the combined infrared light portions of the pixel signals.

25. An electronic apparatus, comprising:
a solid-state imaging device; and
an optical system for forming a subject image on the solid-state imaging device, wherein the solid-state imaging device includes:
a solid-state pixel circuit having unit pixel groups arranged therein, the unit pixel groups including a first plurality of pixels for visible light and a second plurality of pixels for infrared light that perform photoelectric conversion that generates pixel signals; and
a reading part for reading the pixel signals from the solid-state pixel circuit, wherein at least some of the second plurality of pixels for infrared light have a light-receiving sensitivity to infrared light, and in an infrared reading mode, the reading part is configured to combine the pixel signals corresponding to infrared light portions read from the second plurality of pixels for infrared light thereby capturing a near-infrared image based on the combined pixel signals corresponding to the infrared light portions.

* * * * *